(12) United States Patent
Kan et al.

(10) Patent No.: US 7,689,888 B2
(45) Date of Patent: Mar. 30, 2010

(54) DECODING APPARATUS AND METHOD AND PROGRAM

(75) Inventors: Makiko Kan, Tokyo (JP); Toshiyuki Miyauchi, Tokyo (JP)

(73) Assignee: Sony Corporation, Tokyo (JP)

( * ) Notice: Subject to any disclaimer, the term of this patent is extended or adjusted under 35 U.S.C. 154(b) by 1094 days.

(21) Appl. No.: 11/344,048

(22) Filed: Feb. 1, 2006

(65) Prior Publication Data

US 2006/0190799 A1 Aug. 24, 2006

(30) Foreign Application Priority Data

Feb. 7, 2005 (JP) .......................... P2005-029996

(51) Int. Cl.
*H03M 13/00* (2006.01)
(52) U.S. Cl. ........................... 714/758; 714/781
(58) Field of Classification Search ................. 714/758, 714/781
See application file for complete search history.

(56) References Cited

U.S. PATENT DOCUMENTS 7,484,159 B2 * 1/2009 Kan et al. .................... 714/755

OTHER PUBLICATIONS

Srinivas M. Aji and Robert J. McEliece, The Generalized Distributive Law, IEEE Transactions on Information Theory, vol. 46, No. 2, Mar. 2000, pp. 325-343.*
N. Suresh Babu and Karl-Heinz Zimmermann, Decoding of Linear Codes over Galois Rings, IEEE Transactions on Information Theory, vol. 47, No. 4, May 2001, pp. 1599-1603.*
Thomas J. Richardson and Rüdiger L. Urbanke, The Capacity of Low-Density Parity-Check Codes Under Message-Passing Decoding, IEEE Transactions on Information Theory, vol. 47, No. 2, Feb. 2001, pp. 599-618).*
David J.C. MacKay; "Good Error-Correcting Codes Based on Very Sparse Matrices"; IEEE Transactions on Information Theory, vol. 45, No. 2, Mar. 1999; pp. 399-431.
El-Khamy M., et al.; "Iterative soft decoding of Reed-Solomon codes"; Sep. 29, 2005, pp. 1-11, XP 002425478.
Elwyn R. Berlekamp et al.; "On the Inherent Intractability of Certain Coding Problems"; IEEE Transactions on Information Theory; vol. 24; No. 3, May 1987; pp. 384-386.
Jing Jiang et al.; "Iterative Soft Decision Decoding of Reed Solomon Codes Based on Adaptive Parity Check Matrices"; ISIT 2004, Chicago, USA, Jun. 27-Jul. 2, 2004; p. 258.

(Continued)

*Primary Examiner*—Joseph D Torres
(74) *Attorney, Agent, or Firm*—Finnegan, Henderson, Farabow, Garrett & Dunner, L.L.P.

(57) ABSTRACT

A decoding apparatus and method is disclosed by which the decoder error occurrence probability is suppressed and a high decoding performance can be achieved. An ABP decoding apparatus diagonalizes a parity check matrix, updates LLR values, decodes the LLR values and then adds a decoded word obtained by the decoding to a decoded word list. The ABP decoding apparatus repeats the decoding procedure as inner repetitive decoding by a predetermined number of times. Further, as the ABP decoding apparatus successively changes initial values for priority ranks of the LLR values, it repeats the inner repetitive decoding as outer repetitive decoding by a predetermined number of times. Then, the ABP decoding apparatus selects an optimum one of the decoded words from within a decoded word list obtained by the repeated inner repetitive decoding. The invention is applied to an error correction system.

13 Claims, 10 Drawing Sheets

OTHER PUBLICATIONS

Jun Xu et al.; "A general class of LDPC finite geometry codes and their performance"; Proceedings 2002 IEEE International Symposium on Information Theory; ISIT 02 Lausanne, Switzerland, Jun. 30-Jul. 5, 2002, p. 309, XP 010602020.

Marc P.C. Fossorier; "Iterative Reliability-Based Decoding of Low Density Parity Check Code"; IEEE Journal on Selected Areas in Communications, vol. 19, No. 5, May 2001.

Ralf Koetter et al.; "Algebraic Soft-Decision Decoding of Reed-Solomon Codes"; 2001; pp. 1-31.

Ralf Koetter et al.; "Efficient Interpolation and Factorization in Algebraic Soft-Decision Decoding of Reed-Solomon Codes"; pp. 1-6.

Venkatesan Guruswami et al.; "Improved Decoding of Reed-Solomon and Algebraic-Geometry Codes"; IEEE Transactions on Information Theory; vol. 45; No. 6; Sep. 1999; pp. 1757-1767.

* cited by examiner

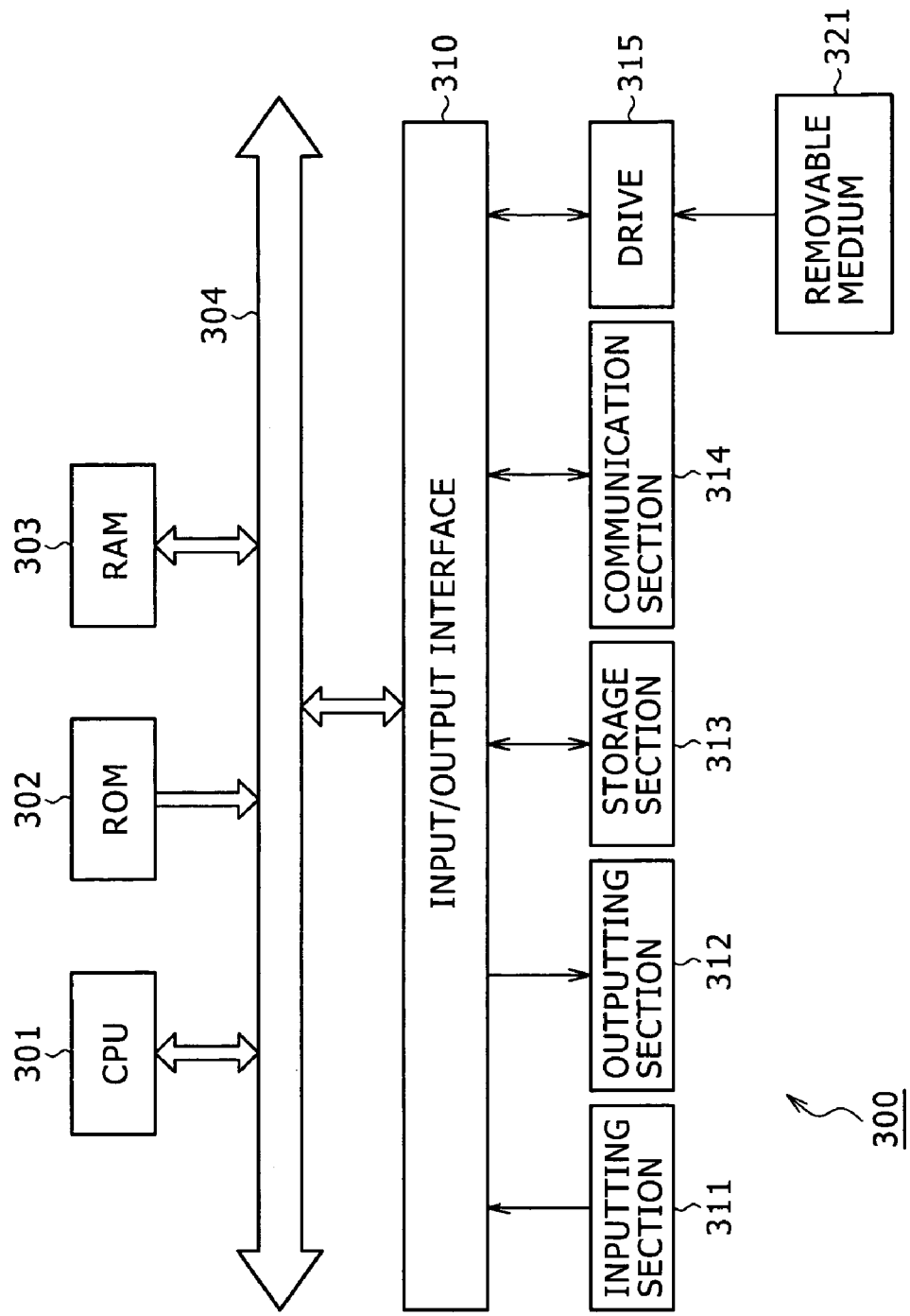

DECODING APPARATUS AND METHOD AND PROGRAM

CROSS REFERENCES TO RELATED APPLICATIONS

The present invention contains subject matter related to Japanese Patent Application JP 2005-029996 filed in the Japanese Patent Office on Feb. 7, 2005, the entire contents of which being incorporated herein by reference.

BACKGROUND OF THE INVENTION

This invention relates to a decoding apparatus and method and a program, and more particularly to a decoding apparatus and method and a program by which the decoding performance can be enhanced in a technique of error correction codes which uses an algebraic procedure.

As a decoding method for algebraic-geometric codes such as, for example, the Reed-Solomon codes or BCH (Bose-Chaudhuri-Hocquenghem) codes which are subfield partial codes of the Reed-Solomon codes, a method is known which makes use of an algebraic property and is superior in both of the performance cost and the calculation cost.

For example, if Reed Solomon codes of a code length n, an information length k, a definition body GF(q) ($q=p^m$, p: prime number) and a minimum distance $d=n-k$ are represented by RS(n, k), then a critical distance decoding method of decoding a hard decision reception word into a codeword having a minimum Hamming distance is well known as a method which assures correction of t error symbols where t satisfies $t<d/2$. Further, list decoding by Guruswami-Sudan (hereinafter referred to as G-S list decoding) method assures correction of t error symbols where $T<\sqrt{nk}$ is satisfied, as disclosed in V. Guruswami, M. Sudan, "Improved decoding of Reed-Solomon and Algebraic-Geometry codes", IEEE Transactions on Information Theory, Vol. 45, pp. 1757 to 1767, 1999.

It is known that list decoding by Koetter-Vardy which uses a soft decision reception word (such list decoding is hereinafter referred to as K-V list decoding) as an extended version of the G-S list decoding described above includes four procedures including calculation of the reliability values of symbols from reception information, extraction of two-variable polynomial interpolation conditions from the reliability values, interpolation of two-variable polynomials and production of a decoded word list by factorization of the interpolation polynomials. Thus, the K-V list decoding has a higher performance than the hard decision decoding. The K-V list decoding is disclosed, for example, in R. Koetter, A. Vardy, "Algebraic soft-decision decoding of Reed-Solomon codes", IEEE Transactions on Information Theory, 2001. Also a method of reducing the calculation cost to a realistic level by re-encoding is known and disclosed, for example, in R. Koetter, J. Ma, A. Vardy, A. Ahmed, "Efficient Interpolation and Factorization in Algebraic Soft-Decision Decoding of Reed-Solomon codes", Proceedings of ISIT 2003.

Meanwhile, attention is paid recently to Low Density Parity-check Codes (LDPC) as linear codes by which a high performance proximate to a marginal performance can be obtained through repetitive decoding using belief propagation. The Low Density Parity-check Codes are disclosed in D. MacKay, "Good Error-Correcting Codes Based on Very Sparse Matrices", IEEE Transactions on Information Theory, 1999.

It is theoretically known that the belief propagation used in the LDPC codes is generally effective only for linear codes having a low density parity check matrix. Meanwhile, to reduce the density of a parity check matrix of the Reed-Solomon codes or the BCH codes is known as an NP-hard problem as disclosed in Berlekamp, R. McEliece, H. van Tilborg, "On the inherent intractability of certain coding problems", IEEE Transactions on Information Theory, vol. 24, pp. 384 to 386, May 1978.

From the foregoing, it has been believed difficult to apply a decoding method in which the belief propagation is used to the Reed-Solomon codes or the BCH codes.

However, it was proved in 2004 by Narayanan et al. that use of a parity-check matrix for which diagonalization is performed in accordance with the reliability of a reception word allows effective application of a decoding method in which the belief propagation is used to the Reed-Solomon codes, BCH codes and other linear codes having a parity-check matrix whose density is not low, as disclosed in Jing Jiang, K. R. Narayanan, "Soft Decision Decoding of RS Codes Using Adaptive Parity Check Matrices", Proceedings of IEEE International Symposium on Information Theory 2004. In the following, the ABP (Adaptive Belief Propagation) decoding method is described.

For example, linear codes C which have a code length n of 6, an information length k of 3 and an encoding ratio r of ½ and has such a 3×6 matrix H as given as an expression (1) below as a parity-check matrix is considered:

$$H = \begin{pmatrix} 1 & 0 & 1 & 0 & 0 & 1 \\ 1 & 1 & 0 & 1 & 0 & 1 \\ 0 & 1 & 1 & 1 & 1 & 1 \end{pmatrix} \quad (1)$$

where the code space C is given by the following expression (2):

$$C = \{c = (c_1, c_2, \ldots, c_6), c_1, c_2, \ldots, c_6 \in 0,1 | H \cdot c^t = 0\} \quad (2)$$

It is assumed that a certain codeword passes through a channel, for example, a certain codeword passes through an AWGN (Adaptive While Gaussian Noise) channel after BPSK (Binary Phase Shift Keying) modulation, and then is received as a reception word as given by the following expression (3) by a receiver:

$$y = (y_1, y_2, \ldots, y_6) = (0.4, 1.2, 0.1, 0.7, 0.3, 0.7) \quad (3)$$

A flow of a decoding process executed by a decoding apparatus of the receiver in such an instance as just described is described below with reference to a flow chart of FIG. 1.

First at step S1, the decoding apparatus searches for a reliability order of a reception word. The decoding apparatus performs ranking of reception symbols (terms on the right side of the expression (3) above) of the received reception word determining the magnitude of the absolute value of each reception symbol as the height of the reliability of the reception symbol. In particular, the decoding apparatus applies numbers to the reception symbols in an ascending order of the reliability, for example, as represented by numerals surrounded by circles in the following expression (4):

$$y = \begin{pmatrix} ③ & ⑥ & ① & ④ & ② & ⑤ \\ 0.4, & 1.2, & 0.1, & 0.7, & 0.3, & 0.7 \end{pmatrix} \quad (4)$$

Then, at step S2, the decoding apparatus re-arranges the thus ranked reception symbols in accordance with a predetermined rule to convert the order of priority ranks of the symbols. This rule is prepared in advance and includes a plurality of sub rules different form each other and equal to the number of times of outer repetition as hereinafter described, and every time outer repetition is performed, a different one of the sub rules is selected.

After the decoding apparatus converts the order, it performs diagonalization of a parity check matrix H in accordance with the order at step S3. For example, where the priority ranks are applied to the reception symbols in an ascending order of the reliability by the conversion of the order, the decoding performs the diagonalization of the parity check matrix H in order beginning with a column corresponding to a symbol whose reliability is lowest.

For example, where the reliability ranks of the reception symbols are such as indicated by the expression (4) given hereinabove, the column of the parity check matrix H which corresponds to a symbol whose reliability is the lowest is the third column, and the column of the parity check matrix H which corresponds to a symbol whose reliability is the second lowest is the fifth column. Further, the column of the parity check matrix H which corresponds to a symbol whose reliability of the third lowest is the first column, and the column of the parity check matrix H which corresponds to a symbol whose reliability is the fourth lowest is the fourth or sixth column while the column of the parity check matrix H which corresponds to a symbol whose reliability is the highest is the second column. The decoding apparatus performs diagonalization of the parity check matrix H in accordance with the priority ranks.

In particular, the decoding apparatus first performs basic transformation of the parity check matrix H focusing on the third column. More particularly, the decoding apparatus first exclusively ORs the first row and the third row so that the third column may be "100" to obtain a new third row thereby to convert the parity check matrix H into the following expression (5):

$$H = \begin{pmatrix} 1 & 0 & 1 & 0 & 0 & 1 \\ 1 & 1 & 0 & 1 & 0 & 1 \\ 1 & 1 & 0 & 1 & 1 & 0 \end{pmatrix} \quad (5)$$

Then, the decoding apparatus performs basic transformation of the parity check matrix H focusing on the fifth column. In particular, the decoding apparatus exchanges the second row and the third row so that the fifth column may be "010" to convert the parity check matrix H into the following expression (6):

$$H = \begin{pmatrix} 1 & 0 & 1 & 0 & 0 & 1 \\ 1 & 1 & 0 & 1 & 1 & 0 \\ 1 & 1 & 0 & 1 & 0 & 1 \end{pmatrix} \quad (6)$$

Thereafter, the decoding apparatus performs basic transformation of the parity check matrix H focusing on the first column. In particular, the decoding apparatus substitutes exclusive OR values of the first row and the third row into the first row and substitutes exclusive OR values of the second row and the third row into the that the first column may be "001" to convert the parity check matrix H into such a parity check matrix $H_{new}$ as indicated by the following expression (7)

$$H = \begin{pmatrix} 0 & 1 & 1 & 1 & 0 & 0 \\ 0 & 0 & 0 & 0 & 1 & 1 \\ 1 & 1 & 0 & 1 & 0 & 1 \end{pmatrix} \quad (7)$$

It is to be noted that, if a column for which it is attempted to perform diagonalization is linearly dependent to a column which has been diagonalized precedently, then the decoding apparatus leaves the column as it is and attempts diagonalization with regard to a column of the next rank. The decoding apparatus performs diagonalization by a number of times equal to the number of ranks of the parity check matrix H in this manner to obtain a new parity check matrix $H_{new}$. Then, the decoding apparatus uses the resulting parity check matrix $H_{new}$ to update the reliability values by the belief propagation at step S4.

FIG. 2 is a Tanner graph corresponding to the parity check matrix $H_{new}$ indicated by the expression (7) above. The belief propagation is implemented by propagating a message along an edge of the Tanner graph. Referring to FIG. 2, variable nodes 11 to 16 correspond to the columns of the matrix (in the case of FIG. 2, the parity check matrix $H_{new}$). Check nodes 21 to 23 correspond to the rows of the matrix (in the case of FIG. 2, the parity check matrix $H_{new}$).

In the following description, i and j are natural numbers, and a message from the ith variable node to the jth check node is represented by $R_{i,j}$; a message from the jth check node to the ith variable node is represented by $Q_{i,j}$; an index set of check nodes connecting to the ith variable node is represented by J(i); and an index set of variable nodes connecting to the jth check node is represented by I(j).

In this instance, updating expressions of the message $R_{i,j}$ and the message $Q_{i,j}$ are represented as given by the following expressions (8) and (9), respectively:

$$R_{i,j} = 2 \tan h^{-1}(\pi_{l \in I(j) \backslash i} \tan h(Q_{i,j}/2)) \quad (8)$$

$$Q_{i,j} = r_j + \theta \Sigma_{l \in J(i) \backslash j} R_{i,l} \quad (9)$$

where the coefficient θ is a convergence factor called vertical step damping factor and has a value defined by $0 < \theta \leq 1$. A reception symbol $y_j$ is set as an initial value of the message $Q_{i,j}$, and updating of extrinsic information $$\Lambda_j^x$$

is performed in accordance with the following expression (10):

$$\Lambda_i^x = \sum_{l \in J(i)} R_{i,l} \quad (10)$$

Thus, the decoding apparatus calculates, at step S5 of FIG. 1, a Log Likelihood Ratio (LLR) $\Lambda_q$ of each code symbol in accordance with the following expression (11):

$$\Lambda_i^q = r_j + \alpha_1 \Lambda_i^x \quad (11)$$

where the coefficient $\alpha_1$ is a convergence factor called adaptive belief propagation damping factor and has a value defined by $0 < \alpha \leq 1$.

After the decoding apparatus calculates the LLR values, it advances the processing to step S6, at which it searches for the reliability order of the calculated LLR values. In particular, the decoding apparatus determines the magnitudes of the absolute values of the calculated LLR values as reliability values and searches for the order of the reliability values. As hereinafter described, updating of the LLR values is performed repetitively until after a predetermined condition is satisfied. The search for the reliability order is performed for next time updating (diagonalization of the parity check matrix H).

Then at step S7, the decoding apparatus decodes the LLR values calculated (updated) in such a manner as described above to obtain decoded words. The decoding method may be, for example, hard decision decoding, critical distance decoding, or K-V list decoding. Then at step S8, the decoding apparatus decides whether or not an inner repetitive decoding stopping condition SC1 which is a condition determined in advance is satisfied.

Updating of the LLR values by the belief propagation is repeated until after repetitive decoding stopping condition SC prepared in advance is satisfied. The decoding apparatus uses the reliability values of the LLR values updated by the belief propagation to update the LLR values again. In particular, the decoding apparatus can update the LLR values by new belief propagation by determining the magnitudes of the absolute values of the resulting LLR values as reliability values and performing diagonalization of the columns of the parity check matrix in an ascending order of the reliability values of the corresponding symbols. Then, every time the decoding apparatus updates the LLR values, it performs decoding using the resulting LLR values (performs decoding repetitively). This is hereinafter referred to as inner repetitive decoding. The decoding apparatus repeats the inner repetitive decoding until after the inner repetitive decoding stopping condition SC1 prepared in advance is satisfied.

In particular, if the decoding apparatus decides at step S8 of FIG. 1 that the inner repetitive decoding stopping condition SC1 is not satisfied, then it returns the processing to step S3 to repeat the processes at the steps beginning with step S3. On the other hand, if the decoding apparatus decides at step S8 that the inner repetitive decoding stopping condition SC1 is satisfied, then it advances the processing to step S9.

At step S9, the decoding apparatus decides whether or not an outer repetitive decoding stopping condition SC2 is satisfied. If the decoding apparatus decides that the outer repetitive decoding stopping condition SC2 is not satisfied, then it returns the processing to step S2 to repeat the processes at the steps beginning with step S2.

In particular, the decoding apparatus prepares a plurality of ranking methods different from each other in addition to the ranking method in which the reliability values of the reception values are used as initial values for the diagonalization priority ranks of the columns of the parity check matrix H. Then, the decoding apparatus performs the inner repetitive decoding described above by a plural number of times (repetitively performs the inner repetitive decoding) serially or parallelly using the plural ranking methods. This is hereinafter referred to as outer repetitive decoding. The decoding apparatus repeats the outer repetitive decoding until after the outer repetitive decoding stopping condition SC2 prepared in advance is satisfied.

An example of the repetitive decoding stopping condition SC where the object linear codes are the Reed-Solomon codes is described below.

For example, it is assumed that the maximum number times of repetition determined in advance is N and the hard-decision result of $\Lambda_q$ is d=(d1, d2, . . . d6). Here, the hard-decision result $d_i$ is represented as given by the following expression (12):

$$d_i = \{1 \text{ if } \Lambda_i^q > 0, 0 \text{ if } \Lambda_i^q \leq 0\} \qquad (12)$$

In this instance, the decoding apparatus can set it as the repetitive decoding stopping condition SC (inner repetitive decoding stopping condition SC1 or outer repetitive decoding stopping condition SC2), for example, that the value of the product of the parity check matrix H and the hard-decision result d is 0 (H·d=0) or the repetition number t is equal to or greater than the maximum number times of repetition determined in advance N (t≧N) (that is, at least one of the two conditions described is satisfied).

Alternatively, the decoding apparatus may set it as the repetitive decoding stopping condition SC (inner repetitive decoding stopping condition SC1 or outer repetitive decoding stopping condition SC2), for example, that critical distance decoding results in success or the repetition number t is equal to or greater than the maximum number times of repetition determined in advance N (t≧N) (that is, at least one of the two conditions described is satisfied). Otherwise, the decoding apparatus may set it as the repetitive decoding stopping condition SC (inner repetitive decoding stopping condition SC1 or outer repetitive decoding stopping condition SC2), for example, that K-V list decoding results in success or the repetition number t is equal to or greater than the maximum number times of repetition determined in advance N (t≧N) (that is, at least one of the two conditions described is satisfied). Or else, the decoding apparatus may set it as the repetitive decoding stopping condition SC (inner repetitive decoding stopping condition SC1 or outer repetitive decoding stopping condition SC2), for example, merely that the repetition number t is equal to or greater than the maximum number times of repetition determined in advance N (t≧N).

After such outer repetitive decoding as described above is performed, if the decoding apparatus decides at step S9 that the outer repetitive decoding stopping condition SC2 is satisfied, then it ends the decoding process.

SUMMARY OF THE INVENTION

However, where any of such techniques which use the adaptive belief propagation in related art as described above is used to perform decoding, there is the possibility that a decoder error, that is, an error which cannot be recognized as an error by the decoding apparatus side, may occur in an ignorable probability, resulting in failure in achievement of a favorable decoding performance with the decoding apparatus.

It is desirable to provide a decoding apparatus and method and a program by which the probability of occurrence of a decoder error is suppressed and a high decoding performance can be achieved.

In order to attain the object described above, according to the present invention, where reliability values updated by adaptive belief propagation are used to perform repetitive decoding, a decoding apparatus retains a list of decoded word candidates obtained intermediately and finally selects the most likely decoded word candidate as a decoded word from within the list.

In particular, according to an embodiment of the present invention, there is provided a decoding apparatus which performs a decoding process for a linear code on ring R, including repetitive decoding means for performing repetitive decoding in which belief propagation is used for a codeword supplied thereto, decoded word list production means for producing and retaining a list of decoded words obtained by the repetitive decoding by the repetitive decoding means, and decoded word selection means for selecting one of the decoded words from within the decoded word list produced by the decoded word list production means.

According to another embodiment of the present invention, there is provided a decoding method for a decoding apparatus which performs a decoding process for a linear code on ring R, including the steps of performing repetitive decoding in which belief propagation is used for a codeword supplied thereto, producing a list of decoded words obtained by the process at the repetitive decoding step and placing the produced decoded word list into a retaining section, and selecting one of the decoded words from within the decoded word list produced by the process at the decoded word list production step.

According to a further embodiment of the present invention, there is provided a program for causing a computer to execute a decoding process for a linear code on ring R, the program including the steps of performing repetitive decoding in which belief propagation is used for a codeword supplied thereto, producing a list of decoded words obtained by the process at the repetitive decoding step and placing the produced decoded word list into a retaining section, and selecting one of the decoded words from within the decoded word list produced by the process at the decoded word list production step.

In the decoding apparatus and method and the program, repetitive decoding in which belief propagation is used is performed for a codeword supplied, and a list of decoded words obtained by the repetitive decoding is produced and retained. Then, one of the decoded words is selected from within the produced decoded word list.

With the decoding apparatus and method and the program, an error correction code technique in which an algebraic procedure is used can be implemented. Particularly, the decoder error occurrence probability can be suppressed, and a higher decoding performance can be achieved.

The above and other objects, features and advantages of the present invention will become apparent from the following description and the appended claims, taken in conjunction with the accompanying drawings in which like parts or elements denoted by like reference symbols.

BRIEF DESCRIPTION OF THE DRAWINGS

FIG. 10 is a block diagram showing an example of a configuration of a personal computer to which the present invention is applied.

DETAILED DESCRIPTION OF THE PREFERRED EMBODIMENT

Before a preferred embodiment of the present invention is described in detail, a corresponding relationship between several features recited in the accompanying claims and particular elements of the preferred embodiment described below is described. The description, however, is merely for the confirmation that the particular elements which support the invention as recited in the claims are disclosed in the description of the embodiment of the present invention. Accordingly, even if some particular element which is recited in description of the embodiment is not recited as one of the features in the following description, this does not signify that the particular element does not correspond to the feature. On the contrary, even if some particular element is recited as an element corresponding to one of the features, this does not signify that the element does not correspond to any other feature than the element.

Further, the following description does not signify that the prevent invention corresponding to particular elements described in the embodiment of the present invention is all described in the claims. In other words, the following description does not deny the presence of an invention which corresponds to a particular element described in the description of the embodiment of the present invention but is not recited in the claims, that is, the description does not deny the presence of an invention which may be filed for patent in a divisional patent application or may be additionally included into the present patent application as a result of later amendment to the claims.

According to the present invention, there is provided a decoding apparatus (for example, an ABP decoding apparatus of FIG. 3) which performs a decoding process for a linear code on ring R. The decoding apparatus includes repetitive decoding means (for example, a decoding control section, a reception word retaining section, a parity check matrix diagonalization section, a belief propagation section, an LLR calculation section, an LLR reliability order search section, and a decoding section of FIG. 3) for performing repetitive decoding in which belief propagation is used for a codeword supplied thereto, decoded word list production means (for example, a decoded word addition section of FIG. 3) for producing and retaining a list of decoded words obtained by the repetitive decoding by the repetitive decoding means, and decoded word selection means (for example, a decoded word selection section of FIG. 3) for selecting one of the decoded words from within the decoded word list produced by the decoded word list production means.

Figure 1:
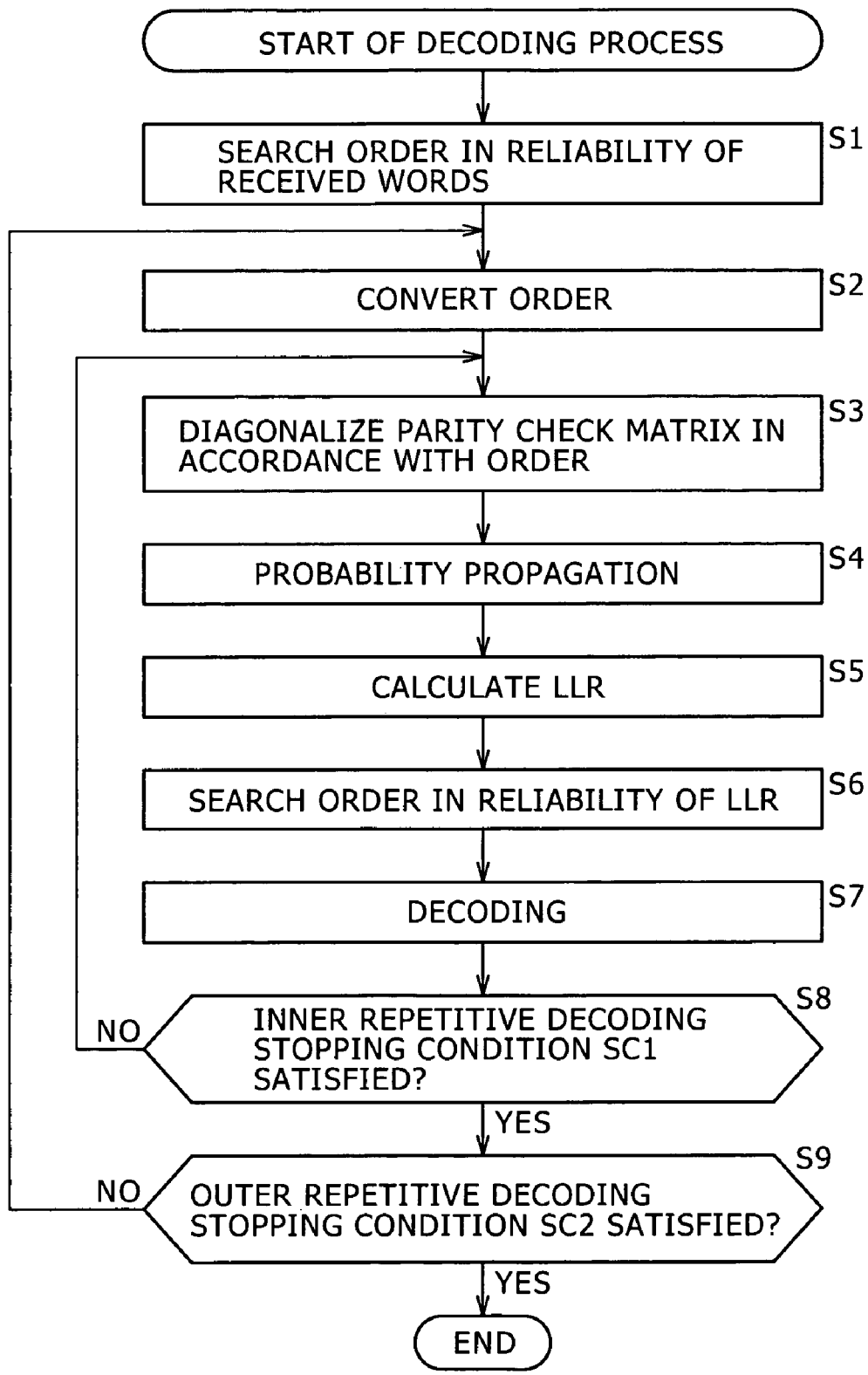
FIG. 1 is a flow chart illustrating a flow of a conventional decoding process.
Figure 2:
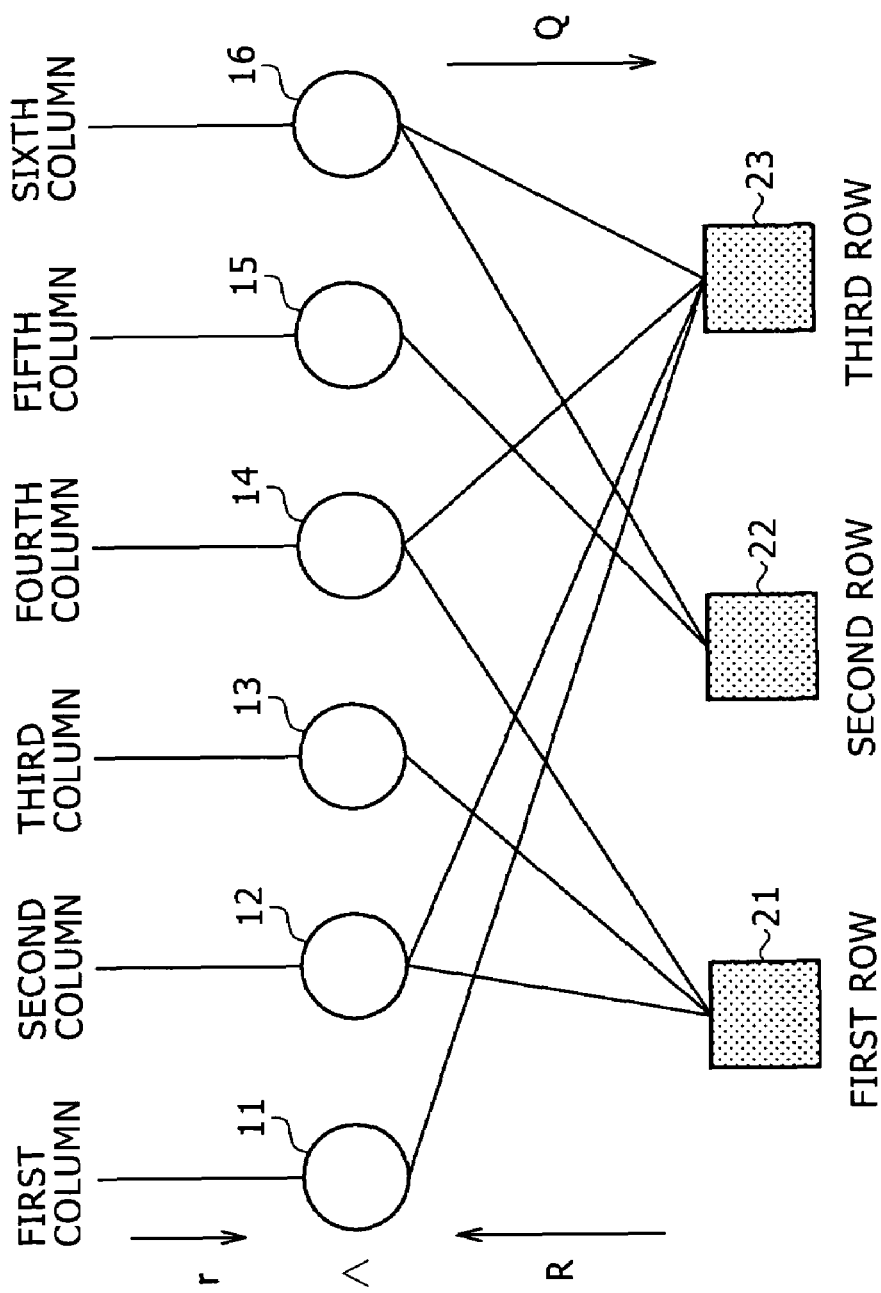
FIG. 2 is a diagram illustrating an example of a Tanner graph corresponding to the conventional decoding process.
Figure 3:
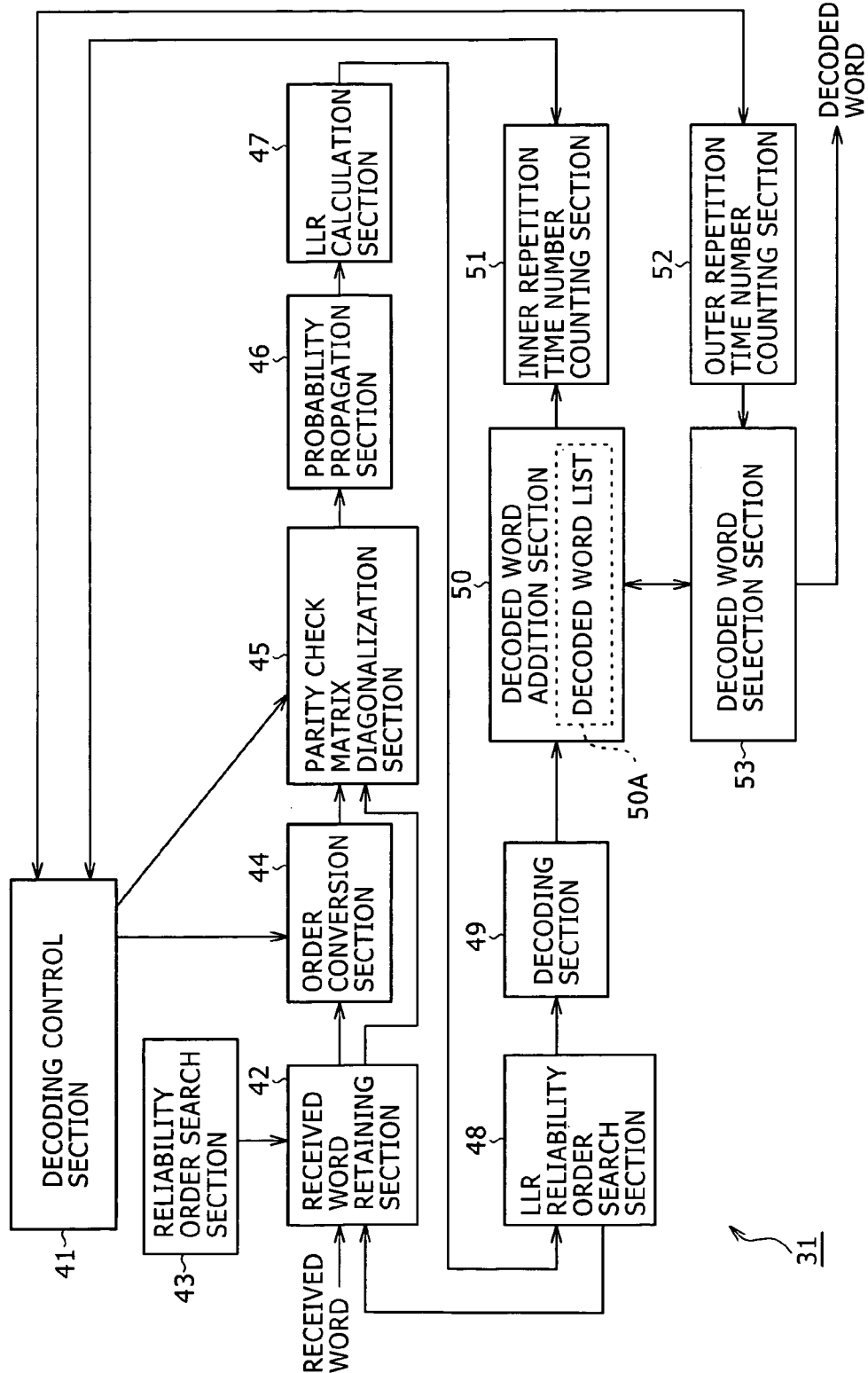
FIG. 3 is a block diagram showing an example of a configuration of a decoding apparatus to which the present invention is applied.

The repetitive decoding means may include retaining means (for example, the reception word retaining section of FIG. 3) for retaining the codeword and information relating to a reliability order which is an order of reliability values of values of symbols of the codeword, diagonalization means (for example, the parity check matrix diagonalization section of FIG. 3) for diagonalizing a parity check matrix based on the information relating to the reliability order retained in the retaining means, belief propagation means (for example, the belief propagation section of FIG. 3) for performing belief propagation using the parity check matrix diagonalized by the diagonalization means to update a message, log likelihood ratio calculation means (for example, the LLR calculation section of FIG. 3) for calculating a log likelihood ratio of each of the symbols of the codeword using the message updated by the belief propagation performed by the belief propagation means, reliability order search means (for example, the LLR reliability order search section of FIG. 3) for searching for a reliability order of the log likelihood ratios calculated by the log likelihood ratio calculation means and updating the codeword and the information relating to the reliability order retained in the retaining means using the log likelihood ratios and the information of the reliability order of the log likelihood ratios, decoding means (for example, the decoding section of FIG. 3) for performing decoding using the log likelihood ratios calculated by the log likelihood ratio calculation means, and decoding control means (for example, the decoding control section of FIG. 3) for controlling the diagonalization means, belief propagation means, log likelihood ratio calculation means, reliability order search means and decoding means to repeat the diagonalization of the parity check matrix, the belief propagation, the calculation of the log likelihood ratios, the search for the reliability order and the decoding by a predetermined number of times, respectively.

Figure 4:
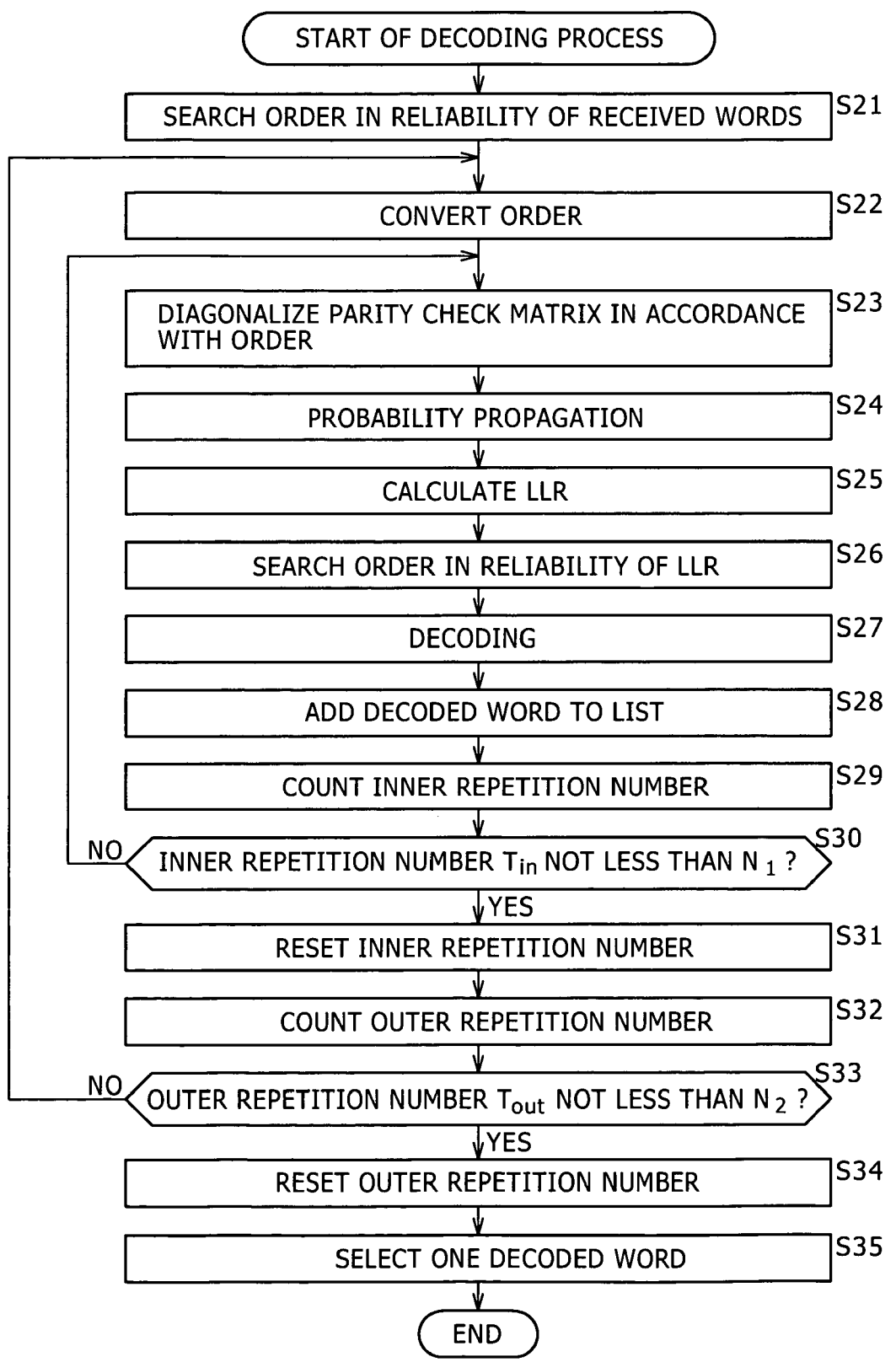
FIG. 4 is a flow chart illustrating a flow of a decoding process executed by the decoding apparatus of FIG. 3.

The predetermined number of times may have a value (for example, a maximum inner repetition time number $N_1$ and a maximum outer repetition time number $N_2$ of FIG. 4) determined in advance.

The diagonalization means may perform the diagonalization preferentially in order beginning with a column of the parity check matrix which corresponds to a reception symbol which has the lowest reliability value (for example, at step S23 of FIG. 4).

The diagonalization means may arrange the columns of the parity check matrix in an ascending order of the reliability of the reception symbols corresponding to the columns, re-arranges part of the order in accordance with a predetermined method, and performs the diagonalization of the columns of the parity check matrix in the re-arranged order (for example, at step S22 of FIG. 4).

The diagonalization means may prepare in advance a plurality of different determination methods for initial values to priority ranks of the columns of the parity check matrix for which the diagonalization is to be performed and change the determination method to be used every time the priority order ranks are initialized (for example, at step S22 of FIG. 4).

The decoding means may use the log likelihood ratios calculated by the log likelihood ratio calculation means to perform hard-definition decoding (for example, at step S27 of FIG. 4).

The decoding means may use finite field $F_q (q=p^m)$ algebraic-geometric codes or isomorphic codes and perform decoding receiving the reliability values obtained by a plural number of times of updating as inputs thereto, p being a prime number (for example, at step S27 of FIG. 4).

The decoding means may receive the reliability values obtained by the plural number of times of updating as inputs thereto to perform hard-decision list decoding according to the Sudan algorithm, the Grusuwami-Sudan algorithm or some other algorithm for the Reed-Solomon codes, the BCH codes or isomorphic codes of the algebraic-geometric codes (for example, at step S27 of FIG. 4).

The decoding means may receive the reliability values obtained by the plural number of times of updating as inputs thereto to perform redundancy setting and soft-decision list decoding according to the Koetter-Vardy algorithm or some other algorithm for the Reed-Solomon codes, the BCH codes or isomorphic codes of the algebraic-geometric codes (for example, at step S27 of FIG. 4).

The decoded word selection means may perform maximum posteriori probability decoding for the decoded words registered in the decoded word list to select one of the decoded words (for example, at step S35 of FIG. 4).

According to the present invention, there is provided a decoding method for a decoding apparatus which performs a decoding process for a linear code on ring R. The decoding method includes a repetitive decoding step (for example, steps S23 to S27 of FIG. 4) of performing repetitive decoding in which belief propagation is used for a codeword supplied thereto, a decoded word list production step (for example, a step S28 of FIG. 4) of producing a list of decoded words obtained by the process at the repetitive decoding step and placing the produced decoded word list into a retaining section, and a decoded word selection step (for example, a step S35 of FIG. 4) of selecting one of the decoded words from within the decoded word list produced by the process at the decoded word list production step.

Also a program of the present invention includes steps same as those of the decoding method according to the invention described above.

Now, a preferred embodiment of the present invention is described with reference to the accompanying drawings.

Referring first to FIG. 3, there is shown an example of a configuration of a decoding apparatus to which the present invention is applied.

The decoding apparatus shown in FIG. 3 is generally denoted by 31 and formed as an ABP (Adaptive Belief Propagation) decoding apparatus which receives a reception word as an input thereto and outputs decoded words obtained by decoding the inputted reception word. The ABP decoding apparatus 31 includes a decoding control section 41, a received word retaining section 42, a reliability order search section 43, an order conversion section 44, a parity check matrix diagonalization section 45, a belief propagation section 46, and an LLR calculation section 47. The ABP decoding apparatus 31 further includes an LLR reliability order search section 48, a decoding section 49, a decoded word addition section 50, an inner repetition time number counting section 51, an outer repetition time number counting section 52, and a decoded word selection section 53.

The decoding control section 41 controls the associated components of the ABP decoding apparatus 31 to perform processes relating to control of a decoding process to be performed by the ABP decoding apparatus 31. The received word retaining section 42 acquires a reception word (codeword) supplied thereto from the outside of the ABP decoding apparatus 31 and temporarily retains the acquired reception word. Further, if priority ranking is performed for reception symbols of such a reception word in response to the degrees of the reliability of the reception symbols by the reliability order search section 43, then the received word retaining section 42 retains information of the priority ranks in a corresponding relationship to the reception symbols. Furthermore, the received word retaining section 42 acquires updated LLR values and information of the reliability ranks (priority ranks) of the LLR values supplied thereto from the LLR reliability order search section 48 (updates the retained information). The received word retaining section 42 supplies the information of the priority ranks of the reception symbols retained in this manner therein to the order conversion section 44.

The reliability order search section 43 performs ranking in reliability of the reception symbols of the reception word (codeword) retained in the received word retaining section 42 in accordance with the magnitudes of the absolute values of the reception symbols. For example, the reliability order search section 43 applies priority ranks to the reception symbols in an ascending order of the reliability (in order from the lowest absolute value) determining that, as the absolute value of the reception symbol becomes higher, the reliability becomes higher.

The order conversion section 44 is controlled by the decoding control section 41 to convert information of the priority ranks of the reception word (reception symbols) supplied thereto from the received word retaining section 42 in accordance with a predetermined algorithm to re-arrange the information. In particular, the order conversion section 44 converts the priority ranks of the reception word (reception symbols) in accordance with one of a plurality of predetermined methods prepared in advance which is selected by the decoding control section 41 and supplies the information obtained by the conversion to the parity check matrix diagonalization section 45.

The parity check matrix diagonalization section 45 is controlled by the decoding control section 41 to perform diagonalization of the columns of the parity check matrix H based on the information of the priority ranks of the reception word (reception symbols) after the conversion supplied from the order conversion section 44 or the information of the priority ranks of the reception word (reception symbols) supplied from the received word retaining section 42. The parity check matrix diagonalization section 45 supplies the parity check matrix $H_{new}$ after the diagonalization to the belief propagation section 46.

The belief propagation section 46 uses the parity check matrix $H_{new}$ supplied thereto from the parity check matrix diagonalization section 45 to perform belief propagation to update the message and supplies the updated message to the LLR calculation section 47. The LLR calculation section 47 calculates the LLR values based on the message supplied thereto to update the LLR values. The LLR calculation section 47 supplies the updated LLR values to the LLR reliability order search section 48.

The LLR reliability order search section 48 searches for a reliability order of the LLR values updated by the LLR calculation section 47 and supplies the searched out information (updated LLR values and information relating to the reliability order of the LLR values) to the received word retaining section 42 and the decoding section 49. The decoding section 49 decodes the LLR values supplied thereto and supplies resulting decoded words to the decoded word addition section 50. It is to be noted that the decoding method by the decoding section 49 may be, for example, critical distance decoding, hard-decision decoding, K-V list decoding or any other method.

The decoded word addition section 50 enlists the decoded words supplied as a result of the decoding thereto from the decoding section 49 and retains a resulting decoded word list 50A (produces and retains a decoded word list). In particular, the decoded word addition section 50 includes a storage area formed from a storage medium such as a semiconductor memory or a hard disk in the inside thereof and retains the resulting decoded words as a list of the decoded words (decoded word list 50A) in the storage area thereof. When a new decoded word is supplied from the decoding section 49, the decoded word addition section 50 additionally stores the decoded word into the decoded word list 50A. Then, the decoded word addition section 50 supplies a process end notification representing that the process is ended to the inner repetition time number counting section 51.

The inner repetition time number counting section 51 has a counter in the inside thereof, and counts the number of times of inner repetitive decoding and retains the count value. In particular, every time a process end notification is received from the decoded word addition section 50, the inner repetition time number counting section 51 counts the number of times of receiving such notifications and supplies the resulting count value (information regarding the number of times of inner repetitive decoding performed till then) to the decoding control section 41. The decoding control section 41 decides based on the count value whether or not the inner repetitive decoding should be ended. When the inner repetitive decoding should be ended, the decoding control section 41 controls the order conversion section 44 to execute the conversion process of the priority ranks of the reception symbols and reset the count value of the inner repetition time number counting section 51. Further, the decoding control section 41 controls the outer repetition time number counting section 52 to increment the count value of the outer repetition time number counting section 52. When the outer repetitive decoding should not be ended, the decoding control section 41 controls the parity check matrix diagonalization section 45 to execute diagonalization of the parity check matrix H.

The outer repetition time number counting section 52 has a counter in the inside thereof, and counts the number of times of outer repetitive decoding and retains the count value. In particular, the outer repetition time number counting section 52 increments the count value thereof under the control of the decoding control section 41 to count the number of times of outer repetitive decoding. Then, every time the outer repetition time number counting section 52 counts, it controls the decoded word selection section 53 to execute selection of a decoded word.

The decoded word selection section 53 is controlled by the outer repetition time number counting section 52 to acquire the decoded word list 50A from the decoded word addition section 50 and select an optimum decoded word (the most likely decoded word) from among the decoded words registered in the decoded word list 50A. At this time, the decoded word selection section 53 performs, for example, MAP (Maximum A Posteriori probability) decoding for the decoded words of the decoded word list 50A to select one optimum decoded word. The decoded word selection section 53 outputs the selected decoded word to the outside of the ABP decoding apparatus 31.

Such a flow of a decoding process as described above is described below with reference to a flow chart of FIG. 4. It is to be noted that the description is given with a particular example applied suitably. In particular, a decoding process where a finite field is $$F_{2^3}$$

and linear codes c are RS(7, 3) of Reed-Solomon codes having a code length of 7 and an information length of 3 are described as a particular example.

Before the flow of a decoding process is described, the parity check matrix H is described. It is to be noted here that the primitive root of $$F_{2^3}$$

is represented by α and the primitive polynomial is represented by the following expression (13):

$$\alpha^3 + \alpha + 1 = 0 \tag{13}$$

Meanwhile, the generating polynomial for formation of a code is represented by the following expression (14):

$$g(x) = (x+1)(x+\alpha)(x+\alpha^2)(x+\alpha^3) \tag{14}$$

In this instance, the parity check matrix H of the code space C is given by the following expression (15):

$$H = \begin{pmatrix} 1 & 1 & 1 & 1 & 1 & 1 & 1 \\ 1 & \alpha & \alpha^2 & \alpha^3 & \alpha^4 & \alpha^5 & \alpha^6 \\ 1 & \alpha^2 & \alpha^4 & \alpha^6 & \alpha^8 & \alpha^{10} & \alpha^{12} \\ 1 & \alpha^3 & \alpha^6 & \alpha^9 & \alpha^{12} & \alpha^{15} & \alpha^{18} \end{pmatrix} \tag{15}$$

As seen from the expression (15), the parity check matrix H is formed from a matrix of 4 rows×7 columns.

Incidentally, since the finite field $$F_{2^3}$$

is a tertiary expansion of $F_2$, it is possible to develop all matrices in a four-dimensional space. In particular, if the parity check matrix H given by the expression (15) above is developed three-dimensionally, then a parity check matrix $H_{exp}$ of 12 rows×21 columns can be obtained on $F_2$ as indicated by the following expression (16):

$$H_{exp} = \begin{pmatrix} 100 & 100 & 100 & 100 & 100 & 100 & 100 \\ 010 & 010 & 010 & 010 & 010 & 010 & 010 \\ 001 & 001 & 001 & 001 & 001 & 001 & 001 \\ \\ 100 & 010 & 101 & 110 & 111 & 011 & 001 \\ 010 & 101 & 110 & 111 & 011 & 001 & 100 \\ 001 & 100 & 010 & 101 & 110 & 111 & 011 \\ \\ 100 & 101 & 111 & 001 & 010 & 110 & 011 \\ 010 & 110 & 011 & 100 & 101 & 111 & 001 \\ 001 & 010 & 110 & 011 & 100 & 101 & 111 \\ \\ 100 & 110 & 001 & 101 & 011 & 010 & 111 \\ 010 & 111 & 100 & 110 & 001 & 101 & 011 \\ 001 & 101 & 011 & 010 & 111 & 100 & 110 \end{pmatrix} \quad (16)$$

In this instance, also a corresponding codeword is developed into 21 bits on $F_2$ as indicated by the following expression (17) similarly as in the case of the parity check matrix H:

$$c = (c_1, c_2, c_3, c_4, \ldots, c_{21}) \quad (17)$$

$$= (0, 1, 0, 1, 1, 0, 0, 0, 1, 1, 0, 0, 0, 0, 0, 1, 1, 0, 0, 0, 1)$$

It is assumed that, by BPSK modulating the codeword and transmitting the BPSK modulated codeword on an AWGN channel, for example, such a reception word y as indicated by the following expression (18) is obtained as an LLR:

$$y = (-1.54, 0.89, 0.25, -0.17, 2.49, -0.18, -1.31, \quad (18)$$
$$-1.82, 2.25, 1.32, -2.69, 0.95, -1.55, -0.34,$$
$$1.26, 4.08, 3.28, -2.40, -1.71, -1.36, 3.79)$$

When such a reception word y as given above is supplied to the ABP decoding apparatus 31 and the received word retaining section 42 retains the reception word y, a decoding process is started. After the decoding process is started, first at step S21, the reliability order search section 43 searches for a reliability order of reception symbols of the reception word y (that is, LLR) retained in the received word retaining section 42.

For example, if the reliability order search section 43 performs a search for a reliability order of the reception word y indicated by the expression (18) above to apply ranks to the reception symbols in an ascending order of the reliability, then the following expression (19) is obtained:

$$y = ( \overset{⑥}{-1.54}, \overset{⑤}{0.89}, \overset{③}{0.25}, \overset{①}{-0.17}, \overset{⑰}{2.49}, \overset{②}{-0.18}, \overset{⑧}{-1.31}, \quad (19)$$

$$\overset{⑩}{-1.82}, \overset{⑯}{2.25}, \overset{⑬}{1.32}, \overset{⑱}{-2.69}, \overset{⑥}{0.95}, \overset{⑫}{-1.55},$$

$$\overset{④}{-0.34}, \overset{⑦}{1.26}, \overset{㉑}{4.08}, \overset{⑲}{3.28}, \overset{⑮}{-2.40}, \overset{⑨}{-1.71}, \overset{⑭}{-1.36}, \overset{⑳}{3.79})$$

In short, in this instance, the order of the indices of the columns of the parity check matrix $H_{exp}$ (expression (16)) to be diagonalized is such as given below where it is lined in an ascending order of the priority ranks from the left:

4, 6, 3, 14, 2, 12, 15, 7, 10, 20, 1, 13, 19, 8, 9, 18, 5, 11, 17, 21, 16

At step S22, the order conversion section 44 converts the order of the priority ranks of the reception symbols (that is, priority order of the columns to be diagonalized in the parity check matrix $H_{exp}$) in this manner as occasion demands. For example, where the priority ranks are to be applied to the reception symbols in an ascending order of the reliability, the order conversion section 44 sets (or changes) the priority ranks of the reception symbols in the order described above.

Then at step S23, the parity check matrix diagonalization section 45 performs diagonalization of the parity check matrix $H_{exp}$ in accordance with the order set (changed) at step S22.

For example, if the parity check matrix diagonalization section 45 diagonalizes the columns of the parity check matrix $H_{exp}$ indicated by the expression (16) in order in accordance with the priority ranks of the reception symbols described above, then a parity check matrix $H_{new}$ represented by the following expression (20) is obtained:

$$H_{new} = \begin{pmatrix} 000 & \boxed{1}10 & 000 & 010 & 100 & 001 & 000 \\ 000 & 010 & 001 & 000 & 1\boxed{1}0 & 000 & 001 \\ 000 & 00\boxed{1} & 010 & 010 & 000 & 011 & 001 \\ 0\boxed{1}0 & 010 & 001 & 010 & 100 & 111 & 000 \\ 00\boxed{1} & 000 & 010 & 010 & 100 & 101 & 001 \\ 000 & 000 & 000 & 01\boxed{1} & 100 & 011 & 001 \\ 000 & 010 & \boxed{1}11 & 000 & 100 & 100 & 000 \\ 000 & 010 & 011 & \boxed{1}10 & 100 & 101 & 001 \\ 000 & 000 & 001 & 010 & 00\boxed{1} & 100 & 000 \\ 000 & 010 & 001 & 010 & 000 & 010 & \boxed{1}00 \\ 000 & 010 & 010 & 000 & 000 & 101 & 0\boxed{1}1 \\ \boxed{1}00 & 000 & 001 & 010 & 000 & 110 & 001 \end{pmatrix} \quad (20)$$

In the expression (20) above, each column which includes a factor of the parity check matrix $H_{new}$ indicated by square is a column to which diagonalization is applied. At step S24, the belief propagation section 46 performs belief propagation using the parity check matrix $H_{new}$ indicated by the expression (20) above to update the message. Then at step S25, the LLR calculation section 47 uses the updated message to update the external information and further calculates LLR values (update the LLR values). At step S26, the LLR reliability order search section 48 searches for a reliability order of the LLR values. As the belief propagation section 46, LLR calculation section 47 and LLR reliability order search section 48 use the parity check matrix $H_{new}$ indicated by the expression (20) given above to perform processes relating to updating of the LLR values in this manner, for example, such new LLR values and reliability ranks of the LLR values as indicated by the following expression (21) are obtained:

$$\Lambda^q = (\overset{\text{⑱}}{-1.68}, \overset{\text{⑤}}{0.83}, \overset{\text{②}}{0.19}, \overset{\text{①}}{-0.08}, \overset{\text{⑲}}{2.19}, \overset{\text{⑥}}{-0.28}, \overset{\text{⑧}}{-1.25},$$
$$\overset{\text{⑬}}{-1.65}, \overset{\text{⑭}}{2.03}, \overset{\text{⑩}}{1.27}, \overset{\text{⑯}}{-2.58}, \overset{\text{②}}{-1.04}, \overset{\text{⑰}}{-1.43}, \overset{\text{③}}{-0.25},$$
$$\overset{\text{⑦}}{1.09}, \overset{\text{㉑}}{3.93}, \overset{\text{⑮}}{3.31}, \overset{\text{⑨}}{-2.31}, \overset{\text{⑫}}{-1.59}, \overset{\text{⑳}}{-1.26}, \overset{\text{⑳}}{3.81}) \tag{21}$$

The LLR reliability order search section 48 places the information into the received word retaining section 42 and supplies the information also to the decoding section 49. At step S27, the decoding section 49 performs decoding such as hard-decision decoding, critical distance decoding or K-V list decoding for the updated new LLR values (expression (21)) to obtain a decoded word. It is to be noted that the decoding section 49 may use any method as the decoding method.

After the decoded word is obtained in this manner, the decoded word addition section 50 adds the newly obtained decoded word to the decoded word list 50A at step S28. At step S29, the inner repetition time number counting section 51 counts the inner repetition number $T_{in}$ which is the number of times of the inner repetitive decoding (increments the count value).

At step S30, the decoding control section 41 decides whether or not the inner repetition number $T_{in}$ (that is, the count value counted by the inner repetition time number counting section 51) is equal to or higher than a maximum inner repetition time number $N_1$ which is a predetermined threshold value determined in advance as the inner repetitive decoding stopping condition SC1 (reaches the maximum inner repetition time number $N_1$).

If the decoding control section 41 decides that the inner repetition number $T_{in}$ is lower than the maximum inner repetition time number $N_1$ (that is, the inner repetition number $T_{in}$ does not reach the maximum inner repetition time number $N_1$), then the decoding control section 41 returns the processing to step S23 so that the processes at the steps beginning with step S23 are executed. In particular, in this instance, the decoding control section 41 controls the parity check matrix diagonalization section 45. The parity check matrix diagonalization section 45 acquires the latest LLR values from the received word retaining section 42 to perform diagonalization of the parity check matrix H.

The processes at steps S23 to S30 are repeated to perform the inner repetitive decoding as described above. If it is decided at step S30 that the inner repetition number $T_{in}$ is equal to or higher than the maximum inner repetition time number $N_1$ (that is, the inner repetition number $T_{in}$ reaches the maximum inner repetition time number $N_1$), then the decoding control section 41 advances the processing to step S31.

At step S31, the inner repetition time number counting section 51 resets the inner repetition number $T_{in}$ to restore its initial value under the control of the decoding control section 41. At step S32, the outer repetition time number counting section 52 counts the outer repetition number $T_{out}$, which is a number of times of outer repetitive decoding, (increments the count value) under the control of the decoding control section 41.

Then at step S33, the decoding control section 41 decides whether or not the outer repetition number $T_{out}$ (that is, the count value counted by the outer repetition time number counting section 52) is equal to or higher than a maximum outer repetition time number $N_2$, which is a predetermined threshold value determined in advance as the outer repetitive decoding stopping condition SC2 (reaches the maximum outer repetition time number $N_2$).

If the decoding control section 41 decides that the outer repetition number $T_{out}$ is smaller than the maximum outer repetition time number $N_2$ (the outer repetition number $T_{out}$ does not reach the maximum outer repetition time number $N_2$), then it returns the processing to step S22 so that the processes at the steps beginning with step S22 are executed. In other words, in this instance, the decoding control section 41 controls the order conversion section 44. The order conversion section 44 acquires the latest LLR values from the received word retaining section 42 and converts the priority order of the reception symbols of the LLR values in accordance with the predetermined method.

In particular, the order conversion section 44 prepares a plurality of methods different from one another (methods of setting the order) in advance as a setting method of the diagonalization priority ranks of the parity check matrix (initial values to the priority ranks in the inner repetitive decoding). The decoding control section 41 selects one of those of the plural methods which are not used as yet and issues an instruction to execute the selected method. The order conversion section 44 performs setting of the diagonalization priority ranks of the parity check matrix (converts the order) under the control of the decoding control section 41 (using the selected method).

For example, it is assumed that the order conversion section 44 adopts an ascending order of the reliability values of the LLR values of the reception word as initial values of the priority ranks in the first cycle of inner repetitive decoding (the priority ranks set by the order conversion section 44 in the first time outer repetition). At this time, the indices of the diagonalization priority ranks of the parity check matrix in the reception word y indicated by the expression (19) given hereinabove are lined in order from the left as given below:

[4, 6, 3, 14, 2, 12, 15], [7, 10, 20, 1, 13, 19, 8], [9, 18, 5, 11, 17, 21, 16]

In contrast, upon setting of initial values to the priority ranks in the second time inner repetitive decoding (when the order conversion section 44 sets the priority ranks in the second time outer repetitive decoding), the order conversion section 44 adopts a method different from the method described hereinabove. For example, the order conversion section 44 changes the order of the indices described hereinabove such that exchange for $21/N_2=21/3=7$ columns as given below is performed:

[7, 10, 20, 1, 13, 19, 18], [4, 6, 3, 14, 2, 12, 15], [9, 18, 5, 11, 17, 21, 16]

In particular, in this instance, in the order of the initial values of the priority ranks in the first time inner repetitive decoding, the priority ranks are exchanged between the reception symbols of the first to seventh priority ranks and the reception symbols of the eighth to 14th priority ranks. Further, the order conversion section 44 adopts, for the initial values to the priority ranks in the second time inner repetitive decoding, another 7-bit exchanging method as given below:

[9, 18, 5, 11, 17, 21, 16], [4, 6, 3, 14, 2, 12, 15], [7, 10, 20, 1, 13, 19, 8]

In particular, in this instance, the priority ranks in the order of the initial values of the priority ranks in the second time inner repetitive decoding are exchanged between the reception symbols of the first to seventh priority ranks and the reception symbols of the 15th to 21st priority ranks.

As a result, the order conversion section 44 can make the initial values to the priority ranks in each cycle of inner repetitive decoding different from one another. In the first cycle of inner repetition, the parity check matrix diagonalization section 45 acquires the initial values set in this manner by the order conversion section 44 and performs diagonalization of the parity check matrix in accordance with the order of the initial values.

The processes at steps S22 to S33 are repeated in such a manner as described above to perform outer repetitive decoding. Then, if the decoding control section 41 decides at step S33 that the outer repetition number $T_{out}$ is equal to or higher than the maximum outer repetition time number $N_2$ (the outer repetition number $T_{out}$ reaches the maximum outer repetition time number $N_2$), then it advances the processing to step S34.

At step S34, the outer repetition time number counting section 52 resets the outer repetition number $T_{out}$ to restore its initial value under the control of the decoding control section 41. Then at step S35, the decoded word selection section 53 executes MAP decoding or the like to select one of the decoded words which is likely to be optimum (most likely decoded word) from within the decoded word list produced by the decoded word addition section 50 and outputs the selected decoded word as a decoded word to the outside of the ABP decoding apparatus 31.

After the process at step S35 is completed, the decoded word selection section 53 ends the decoding process. The ABP decoding apparatus 31 performs such a decoding process as described above for each of received reception words.

Figure 5:
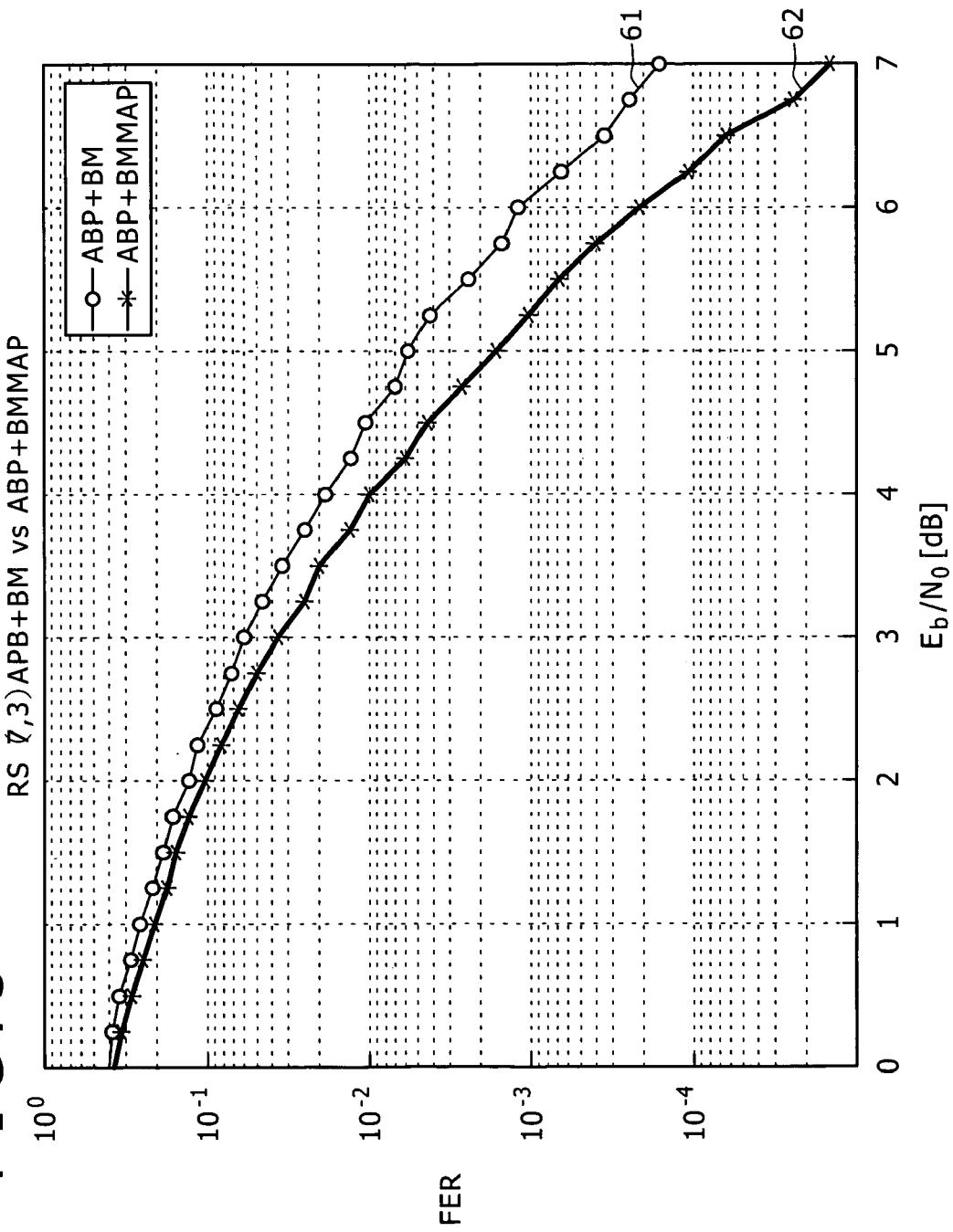
FIG. 5 is a graph illustrating comparison between frame error ratios by the conventional decoding process and the decoding process by the decoding apparatus of FIG. 3.

FIG. 5 is a graph illustrating comparison between the decoding performance where the abbreviated Reed-Solomon code RS(7, 3) is decoded by the conventional ABP decoding method as described above and the decoding performance where the abbreviated Reed-Solomon code RS(7, 3) is decoded by the ABP decoding method described hereinabove to which the present invention is applied.

Referring to FIG. 5, a graph represented by a curve 61 indicates the decoding performance where the conventional ABP decoding method is applied, and another graph represented by a curve 62 indicates the decoding performance where the ABP decoding method to which the present invention is applied is used. It is to be noted that, in the conventional ABP decoding method, the success in critical distance decoding is used as the inner repetitive decoding stopping conditions SC1 and SC2, and the critical distance decoding is performed based on the updated LLR values. Meanwhile, in the ABP decoding method to which the present invention is applied, the maximum inner repetition time number $N_1$ is set to 5 while the maximum outer repetition time number $N_2$ is set to 1, and decoded words decoded in every repetition are secured as a list and MAP decoding is performed finally. As seen in FIG. 5, in the case of the ABP decoding method to which the present invention is applied (curve 62), the frame error rate (FER) indicated by the axis of ordinate is lower than that of the case of the conventional ABP decoding method (curve 61). Consequently, it can be recognized that the error correction capacity is enhanced.

As described above, the ABP decoding apparatus 31 enlists decoded words obtained by repetitive decoding (adds the decoded words to the decoded word list) and selects, after inner repetitive decoding and outer repetitive decoding are repeated by the inner repetitive decoding time number and the outer repetitive decoding time number which are set to predetermined numbers of times set in advance, respectively, an optimum one of the decoded words from within the resulting decoded word list in accordance with the predetermined method. Therefore, the occurrence probability of a data error which cannot be recognized as an error upon decoding can be suppressed, and consequently, a higher decoding performance can be achieved.

In addition, the ABP decoding apparatus 31 performs MAP decoding for a reception word not from the beginning but after repetitive decoding is performed to narrow down candidates of decoded words. Therefore, not only it is possible to reduce the load of the decoding process and perform the decoding process at a higher speed, but also it is possible to reduce the production cost and the operation cost.

It is to be noted that, when the adaptive belief propagation is performed to update the LLR values as described above, there is no necessity to perform decoding in all processes of repetition or add candidates to the decoded word list, but the processes may be performed partly. For example, decoding may be performed in the last one cycle of the inner repetitive decoding to add candidates to the decoded word list.

Further, when one of decoded words which is likely to be optimum is to be selected from within the resulting decoded word list, not the MAP decoding but an arbitrary selection method can be applied. For example, a decoded word may be selected by such a procedure that the reliability values of the individual bits (reception symbols) are compared to remove a codeword which has not less than a predetermined number of bits whose reliability is equal to or lower than a predetermined threshold value from the list.

Further, while, in the foregoing description, the ABP decoding apparatus 31 decodes Reed-Solomon codes, the codes to be decoded are not limited to them, but, for example, BCH codes may be decoded or decoding may be applied to any other decoding method.

Figure 6:
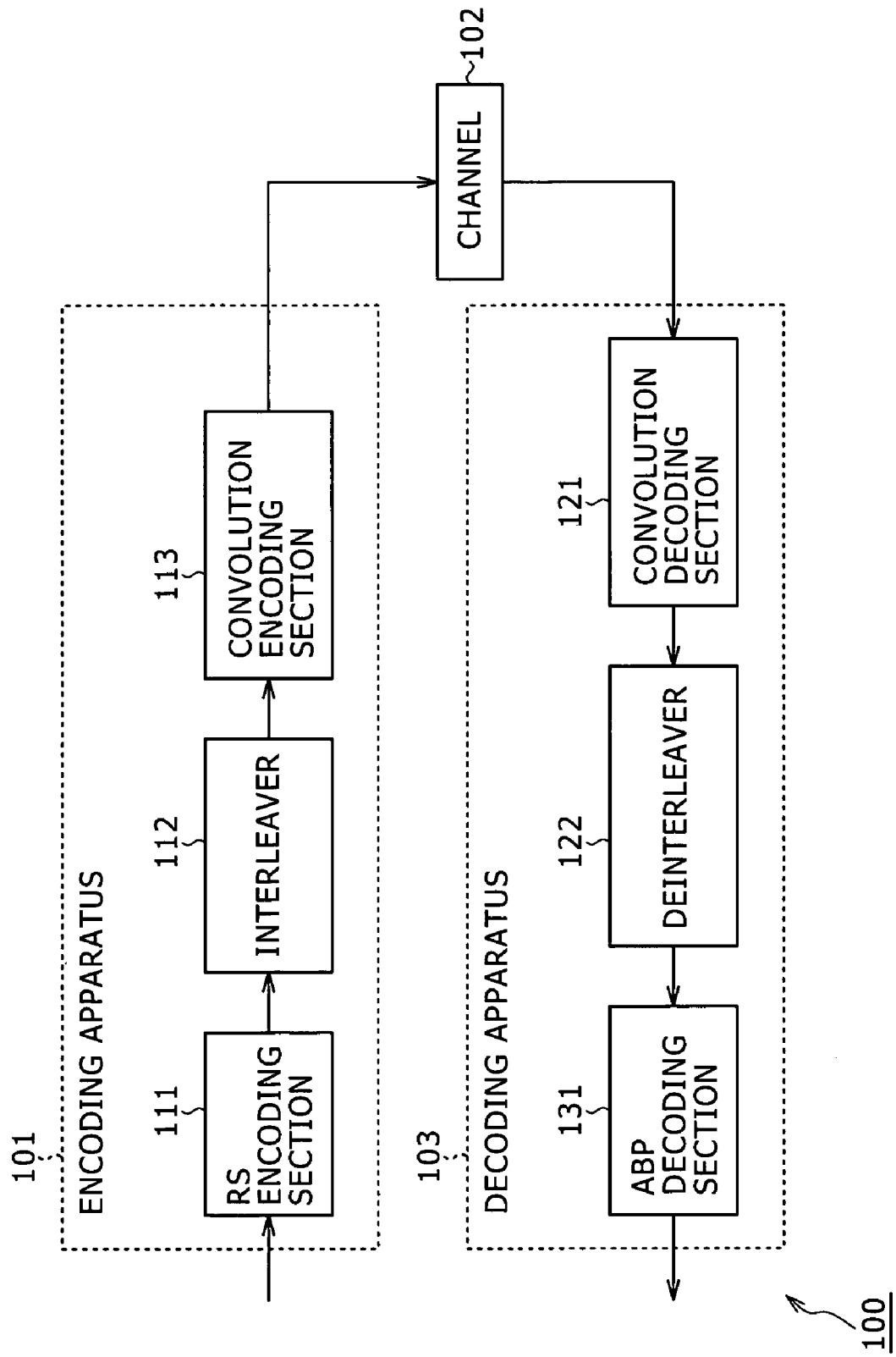
FIG. 6 is a block diagram showing an example of a configuration of an error correction system to which the present invention is applied.

Now, a particular example of the method of applying such ABP decoding as described above to an error correction system is described. FIG. 6 illustrates an example wherein the ABP decoding of the present invention is applied to an error correction system. Referring to FIG. 6, the error correction system 100 shown is a digital signal transmission and reception system which is utilized for television broadcasting or the like and includes an encoding apparatus 101, a channel 102 and a decoding apparatus 103.

The encoding apparatus 101 is formed as a transmission apparatus which transmits a television signal in the form of a digital signal, for example, as in a broadcasting station or the like. The encoding apparatus 101 includes a Reed-Solomon encoding section (RS encoding section) 111, an interleaver 112, and a convolution encoding section 113.

The RS encoding section 111 encodes information inputted thereto using the Reed-Solomon code and outputs a resulting code. The interleaver 112 performs re-arrangement of digital information inputted thereto and outputs resulting digital information. The convolution encoding section 113 performs convolution encoding for digital information inputted thereto and outputs a resulting code.

Digital information for transmission supplied from the outside of the encoding apparatus 101 is Reed-Solomon encoded by the RS encoding section 111 of the encoding apparatus 101 and then supplied to the interleaver 112. The interleaver 112 performs re-arrangement (interleaving) of the information in order to disperse burst errors which appear principally in the channel 102 which is a communication line. Since the Reed-Solomon encoding involves error correction of a plurality of bits as one symbol, the interleaver 112 performs symbol interleaving of dispersing burst errors in a unit of a symbol.

The digital information for transmission for which the interleaving has been performed further undergoes convolution encoding which is performed by the convolution encoding section 113 and by which a code series is determined sequentially based on a plurality of information blocks. For example, if the digital information is supplied for each information block of k bits from the interleaver 112, then the convolution encoding section 113 having constraint length K encodes the digital information into a code block of n bits based on K information blocks including not only the information block supplied in the present cycle but also information blocks supplied in the past.

Then, the convolution encoded digital information is converted into data of a data format in which the data can be transmitted and signaled on the channel 102 by a communication section not shown. In other words, the encoding apparatus 101 encodes and transmits (broadcasts) the television signal supplied thereto. The transmitted transmission word is supplied to the decoding apparatus 103 through the channel 102. In other words, the channel 102 is a wired or wireless transmission line along which the television signal is transmitted.

The decoding apparatus 103 is formed, for example, as a reception apparatus (digital television receiver or the like) which receives a television signal transmitted (broadcast) from a broadcasting station (encoding apparatus 101). The decoding apparatus 103 includes a convolution decoding section 121, a deinterleaver 122, and an ABP decoding section 131.

The convolution decoding section 121 performs soft-decision decoding of a convolution code represented by decoding, for example, by the BCJR (Bahl, Cocke, Jelinek, and Raviv) algorithm or the SOVA (Soft Output Viterbi Algorithm) for an input thereto and outputs a resulting decoded word. The deinterleaver 122 returns interleaved information into information of the original order. The ABP decoding section 131 corresponds to the ABP decoding apparatus 31 shown in FIG. 3 which is adapted to the error correction system 100, and has a basically similar configuration to that of the ABP decoding apparatus 31 and performs processing similar to that of the ABP decoding apparatus 31. Accordingly, the description of the ABP decoding apparatus 31 given hereinabove can be applied to description of the configuration and the substance of processing of the ABP decoding section 131, and therefore, details description of them is omitted herein to avoid redundancy. However, the ABP decoding section 131 generally performs an ABP repetitive decoding process for information (deinterleaved result of soft-decision decoding) supplied thereto from the deinterleaver 122, selects an optimum decoded word by MAP decoding or the like from within a decoded word list produced by the ABP repetitive decoding process, and outputs the selected decoded word.

The decoding apparatus 103 decodes a received television signal. In particular, the decoding apparatus 103 receives a transmission word transmitted on the channel 102 through the communication section not shown. The received transmission word (that is, reception word) is supplied to the convolution decoding section 121, by which soft-decision decoding of a convolution code is performed. The deinterleaver 122 acquires the convolution decoded reception word and deinterleaves the information in accordance with a method corresponding to the method of interleaving performed by the interleaver 112 of the encoding apparatus 101 to restore the original order of the interleaved information. The ABP decoding section 131 performs ABP repetitive decoding for the digital information of the restored order in accordance with the method described hereinabove, and performs, after updating of the reliability values by the ABP, critical distance decoding after hard decision, list decoding or soft-decision list decoding in which soft values are inputted as they are. Then, the ABP decoding section 131 outputs a resulting decoded word (regenerated digital information same as digital information before encoded by the encoding apparatus 101) to the outside of the decoding apparatus 103.

The decoding apparatus 103 in the error correction system 100 of FIG. 6 can perform a decoding process of a high performance readily in such a manner as described above and can achieve communication of a higher degree of accuracy. Further, since the decoding apparatus 103 performs repetitive decoding to narrow down candidates to a decoded word before the ABP decoding section 131 performs MAP decoding, the load of the decoding process can be reduced and the production cost and the operation cost of the decoding apparatus 103 can be suppressed.

It is to be noted that, while the error correction system 100 in the foregoing description uses Reed-Solomon codes, the codes to be used are not limited to them, but, for example, the BCH codes may be applied or any other coding method may be applied.

Figure 7:
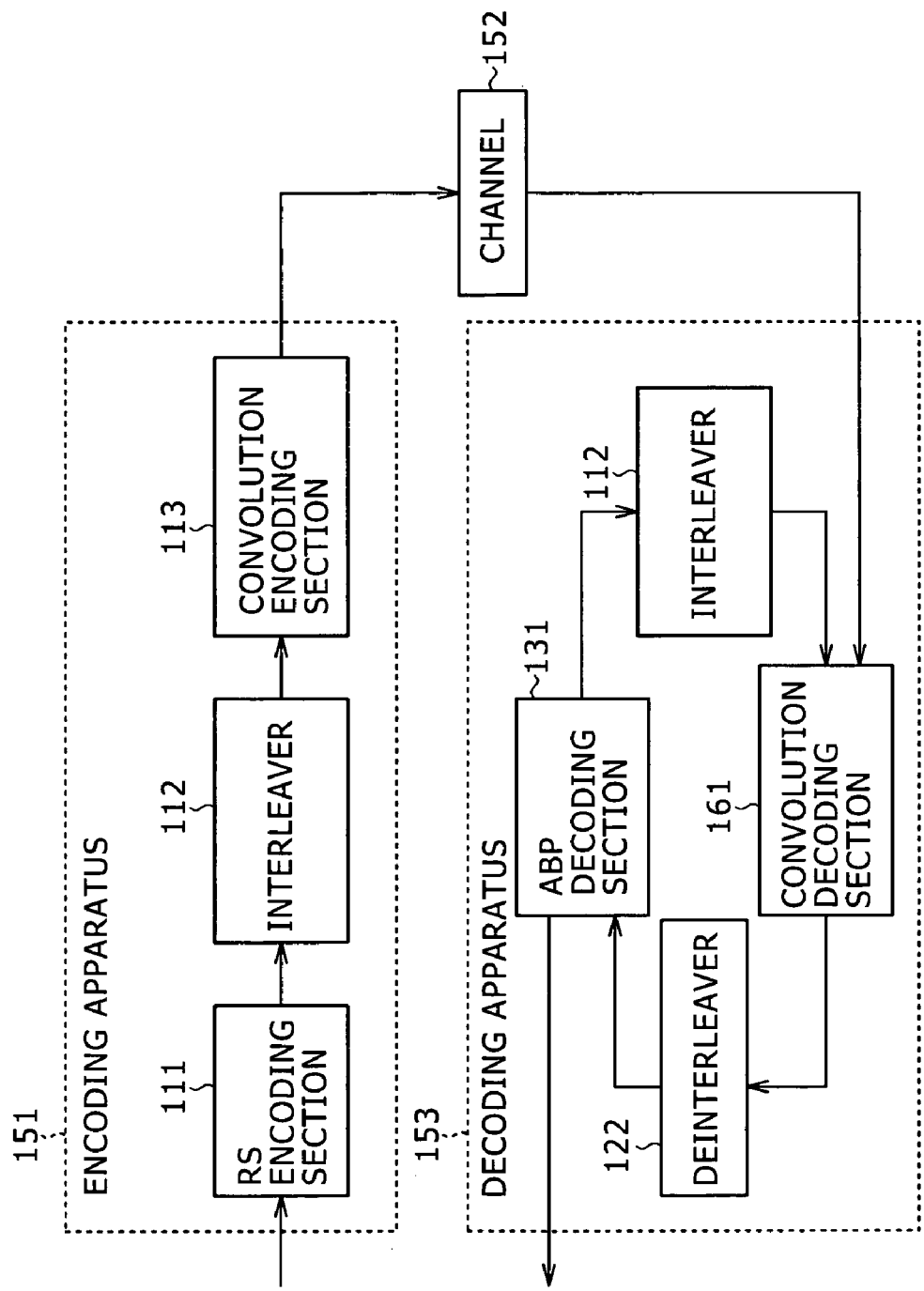
FIGS. 7 to 9 are similar views but showing different examples of the configuration of the error correction system to which the present invention is applied.

FIG. 7 illustrates another example wherein the ABP decoding of the present invention is applied to another error correction system. Referring to FIG. 7, the error correction system 150 shown includes an encoding apparatus 151, a channel 152, and a decoding apparatus 153 and is used for a digital communication system such as, for example, a digital television system.

The encoding apparatus 151 is an apparatus similar to the encoding apparatus 101 of FIG. 6, and has a configuration basically similar to that of the encoding apparatus 101 and performs processing similar to that of the encoding apparatus 101. In particular, the encoding apparatus 151 includes an RS encoding section 111, an interleaver 112 and a convolution encoding section 113. The components of the encoding apparatus 151 are similar to those of the encoding apparatus 101, and therefore, overlapping description of them is omitted herein to avoid redundancy.

The channel 152 is similar to the channel 102 of FIG. 6 and is a wired or wireless transmission line along which a television signal is transmitted.

The decoding apparatus 153 includes a convolution decoding section 161, a deinterleaver 122, an ABP decoding section 131, and an interleaver 112. The convolution decoding section 161 acquires a reception word received through a communication section not shown (transmission word transmitted from the encoding apparatus 151 through the channel 152) and performs soft-decision decoding for the reception word using, for example, the BCJR algorithm or the SOVA. Then, the convolution decoding section 161 supplies the soft-decision decoded reception word to the deinterleaver 122. Also a reception word for which ABP repetitive decoding is performed by the ABP decoding section 131 is interleaved again and supplied from the interleaver 112 to the convolution decoding section 161. The ABP decoding section 131 performs soft-decision decoding also for the reception word using, for example, the BCJR algorithm or the SOVA similarly as in the case of the reception word supplied from the communication section not shown, and supplies decoded reception word to the deinterleaver 122.

The deinterleaver 122 operates similarly to that in the decoding apparatus 103 of FIG. 6 to deinterleave the soft-decision decoding result supplied thereto from the convolution decoding section 161 and supplies a result of the deinterleaving to the ABP decoding section 131.

The ABP decoding section 131 operates similarly to that in the decoding apparatus 103 of FIG. 6 to perform an ABP repetitive decoding process for information (deinterleaved soft-decision decoding result) supplied thereto from the deinterleaver 122. Then, the ABP decoding section 131 selects an optimum decoded word by MAP decoding or the like from within a decoded word list produced by the ABP repetitive decoding process and outputs the selected decoded word. Further, the ABP decoding section 131 supplies the decoded word to the interleaver 112.

The interleaver 112 operates similarly to that in the encoding apparatus 151 and interleaves information (decoded word) supplied thereto from the ABP decoding section 131 into information of a predetermined order. The interleaving pattern by the interleaver 112 is similar to that in the case of the encoding apparatus 151. The digital information interleaved in this manner is supplied to the convolution decoding section 161.

As described above, the decoding apparatus 153 repetitively performs soft-decision decoding by the convolution decoding section 161 and repetitive decoding by the ABP decoding section 131 for a reception word acquired through the communication section not shown through the deinterleaver 122 and the interleaver 112 to successively reduce the decoding error probability in the decoding process. It is to be noted that the number of times of repetition of decoding by the entire decoding apparatus 153 may be determined in advance, or it may be decided whether or not such repetition should be stopped based on a predetermined condition such as the number of places for which error correction should be performed.

In this manner, in the error correction system 150 of FIG. 7, the decoding apparatus 153 can perform a decoding process of a high performance readily and can communicate with a high degree of accuracy. Further, since the decoding apparatus 103 narrows down candidates to a decoded word by performing repetitive decoding before the ABP decoding section 131 performs MAP decoding, the load of the decoding process can be reduced, and the production cost and the operation cost of the decoding apparatus 103 can be suppressed.

It is to be noted that, while the error correction system 150 described above uses Reed-Solomon codes, the codes to be used are not limited to them, but, for example, the BCH codes may be applied, or any other encoding method may be applied.

Figure 8:
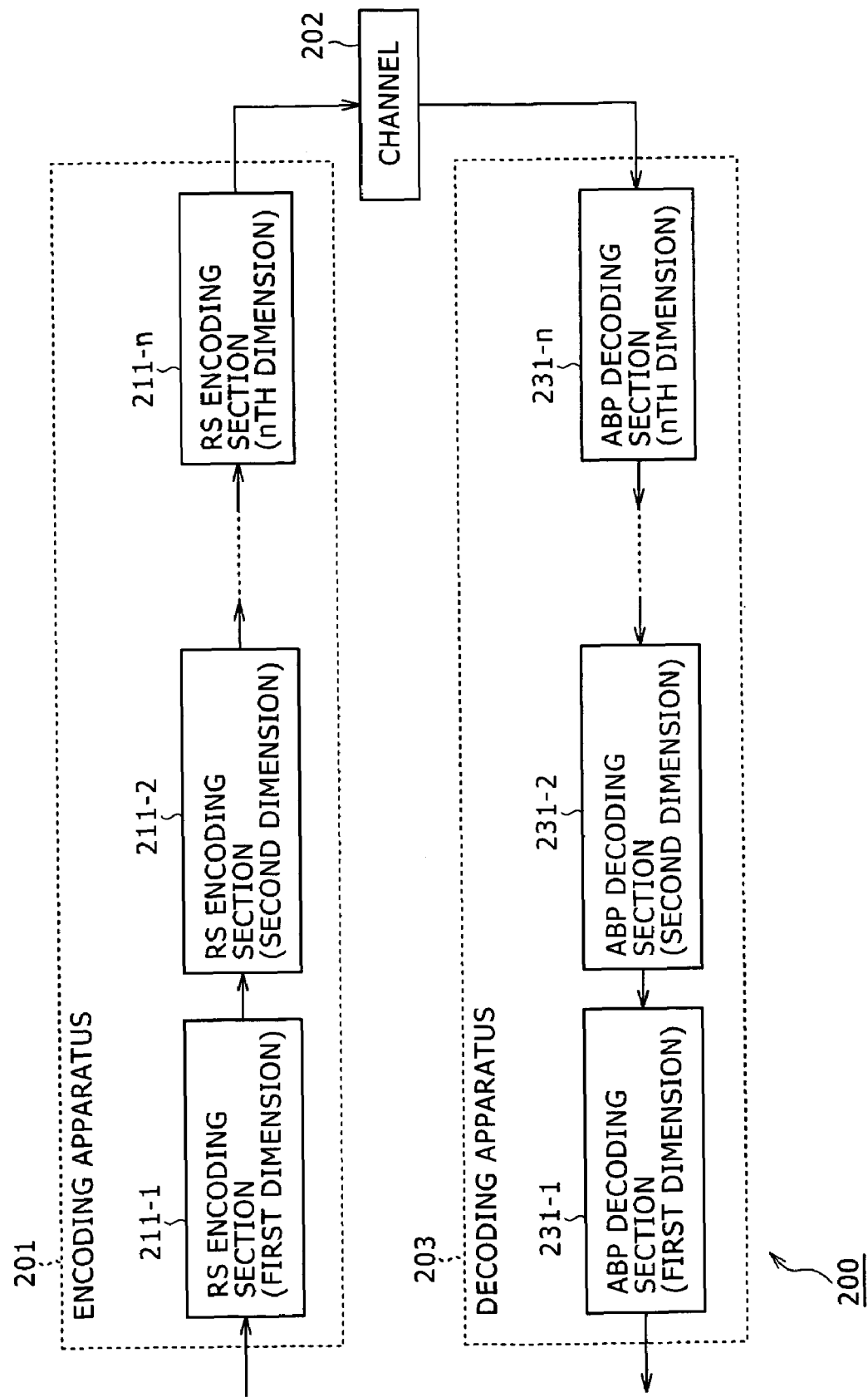

FIG. 8 illustrates a further example wherein the ABP decoding of the present invention is applied to a further error correction system. Referring to FIG. 8, the error correction system 200 shown includes an encoding apparatus 201, a channel 202, and a decoding apparatus 203, and is used in a digital recording medium recording and reproduction apparatus such as a DVD (Digital Versatile Disk) record player.

In particular, the recording and reproduction apparatus (error correction system 200) encodes digital information supplied thereto from the outside by means of the encoding processing section (201) and records the encoded digital information on the recording medium (channel 202) by means of a recording and reproduction processing section not shown. Further, the recording and reproduction apparatus (error correction system 200) reproduces digital information recorded on the recording medium (channel 202) by means of the recording and reproduction section, performs a decoding process for the reproduced digital information by means of the decoding processing section (decoding apparatus 203) to acquire original digital information, and outputs the digital information to the outside.

The encoding apparatus 201 includes Reed-Solomon encoding sections (RS encoding sections) 211-1 to 211-$n$ ($n$ is a natural number) which perform Reed-Solomon encoding relating to different dimensions from one another for digital information.

For example, digital information supplied from the outside of the encoding apparatus 201 undergoes Reed-Solomon encoding relating to the first dimension by the RS encoding section 211-1. Then, the digital information successively undergoes Reed-Solomon encoding relating the dimensions from the second dimension to the nth dimension by the RS encoding sections 211-2 to 211-$n$, respectively. When the encoding by the RS encoding section 211-$n$ is completed, the encoding apparatus 201 supplies the encoded digital information to the recording and reproduction processing section (not shown).

The recording and reproduction processing section applies conversion such as NRZI (Non-Return to Zero Invert) conversion (NRZI encoding) to the information supplied thereto from the encoding apparatus 201 and records the converted information on the recording medium (channel 202). Further, the recording and reproduction processing section reproduces digital information (Reed-Solomon encoded digital information) recorded on the recording medium (channel 202), inversely NRZI converts (decodes) the reproduced digital information, and supplies the decoded digital information to the decoding apparatus 203.

The decoding apparatus 203 is a decoder corresponding to the encoding apparatus 201 and includes n ABP decoding sections (ABP decoding sections 231-1 to 231-$n$) which perform an ABP repetitive decoding process) relating to dimensions different from one another for digital information.

The ABP decoding sections 231-1 to 231-$n$ correspond to the RS encoding sections 211-1 to 211-$n$ of the encoding apparatus 201, respectively, and perform a repetitive decoding process, in which the ABP is used, and a selection process of an optimum decoded word from within a decoded word list obtained by the repetitive decoding process for Reed-Solomon codes relating to the dimensions. The ABP decoding sections 231-1 to 231-$n$ have a configuration basically similar to that of the ABP decoding apparatus 31 shown in FIG. 3 and perform operation basically similar to that of the ABP decoding apparatus 31. Accordingly, the ABP decoding sections of the decoding apparatus 203 can apply the block diagram of FIG. 3 and the flow chart shown in FIG. 4 similarly as in the case of the ABP decoding section 131 of FIG. 6 or 7.

In particular, in the decoding apparatus 203, the ABP decoding sections (ABP decoding sections 231-1 to 231-$n$) perform a repetitive decoding process and so forth as described hereinabove. Thereupon, as seen in FIG. 8, the decoding apparatus 203 operates reversely to the operation of the encoding apparatus 201. In particular, in the decoding apparatus 203, the ABP decoding section 231-$n$ first performs a decoding process relating to the nth dimension, and then the ABP decoding sections connected in series perform a decoding process successively decreasing the dimension number to the n–1th dimension, n–2th dimension and so forth. Finally, the ABP decoding section 231-1 performs a decoding process relating to the first dimension. The decoding apparatus 203 outputs the original digital information restored in this manner to the outside of the recording and reproduction apparatus (error correction system 200).

The decoding apparatus 203 of the error correction system 200 having the configuration described above can perform a decoding process of a high performance readily. In other words, the error correction system 200 as a recording and reproduction apparatus can record and reproduce digital information with a higher degree of accuracy. Further, since the decoding apparatus 203 performs repetitive decoding to narrow down candidates to a decoded word before the ABP decoding sections 231-1 to 231-$n$ perform MAP decoding (selection of a decoded word), the load of the decoding process can be reduced and the production cost and the operation cost of the decoding apparatus 203 can be suppressed.

It is to be noted that, while the error correction system 200 described above uses the Reed-Solomon codes, the codes to be used are not limited to them, but, for example, the BCH codes may be applied, or any other encoding method may be applied.

Figure 9:
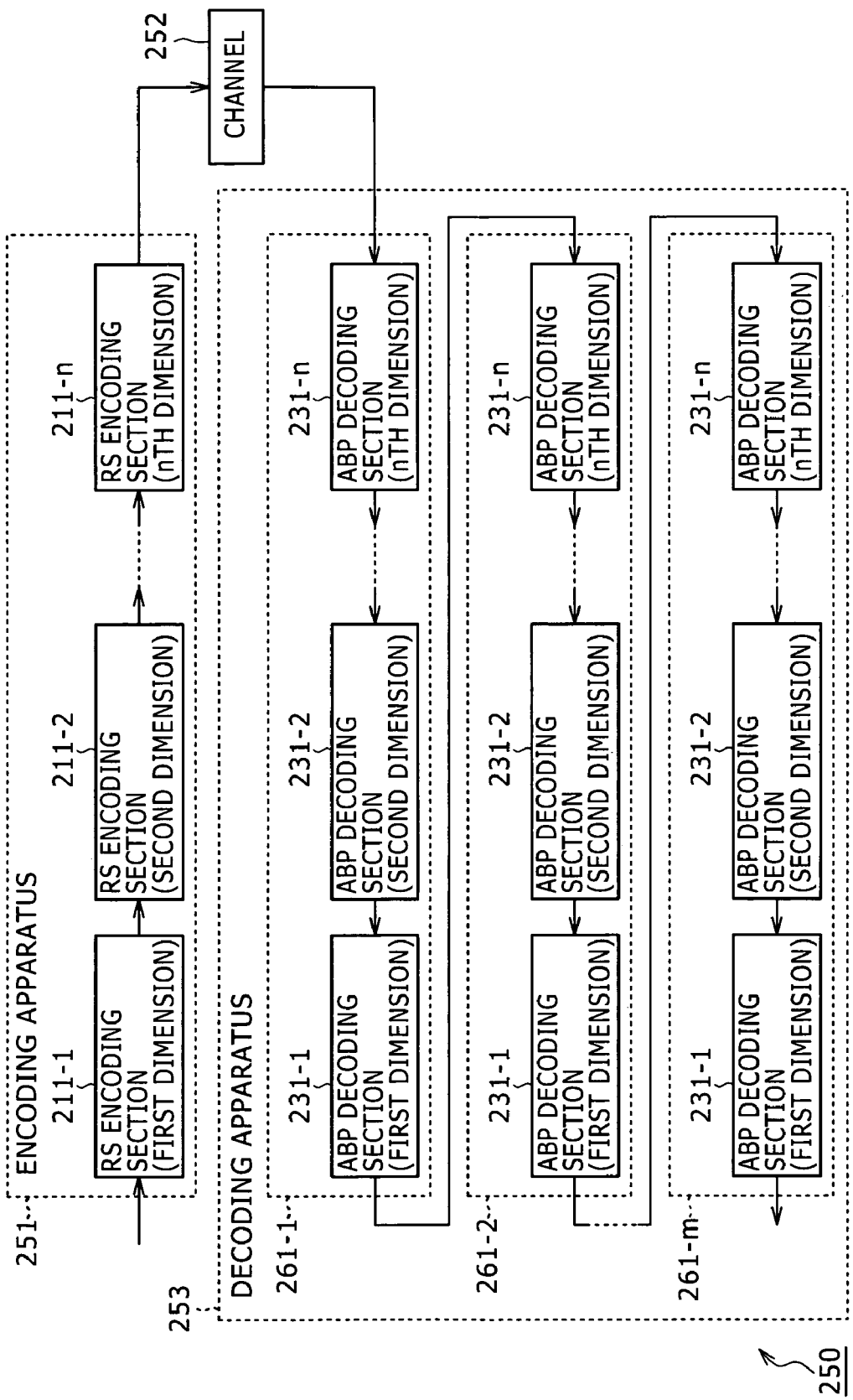

FIG. 9 illustrates a still further example wherein the ABP decoding of the present invention is applied to a still further error correction system. Referring to FIG. 9, the error correction system 250 shown includes an encoding apparatus 251, a channel 252, and a decoding apparatus 253, and is used in a digital recording medium recording and reproduction apparatus such as a DVD record player.

In particular, similarly to the error correction system 200 shown in FIG. 8, the recording and reproduction apparatus (error correction system 250) encodes digital information supplied thereto from the outside by means of the encoding processing section (encoding apparatus 251) and records the encoded digital information on the recording medium (channel 252) by means of a recording and reproduction processing section not shown. Further, the recording and reproduction apparatus (error correction system 250) reproduces digital information recorded on the recording medium (channel 252) by means of the recording and reproduction section, performs a decoding process for the reproduced digital information by means of the decoding processing section (decoding apparatus 253) to acquire original digital information, and outputs the digital information to the outside.

The encoding apparatus 251 is an encoding apparatus similar to the encoding apparatus 201 of FIG. 8, and has a configuration similar to that of the encoding apparatus 201 and performs similar processing. In particular, digital information supplied from the outside of the encoding apparatus 251 undergoes Reed-Solomon encoding relating to the first dimension by the RS encoding section 211-1. Then, the digital information successively undergoes Reed-Solomon encoding relating to the dimensions from the second dimension to the nth dimension by the RS encoding sections 211-2 to 211-n, respectively. When the encoding by the RS encoding section 211-n is completed, the encoding apparatus 251 supplies the encoded digital information to the recording and reproduction processing section (not shown).

The recording and reproduction processing section applies conversion such as NRZI (Non-Return to Zero Invert) conversion (NRZI encoding) to the information supplied thereto from the encoding apparatus 251 and records the converted information on the recording medium (channel 252). Further, the recording and reproduction processing section reproduces digital information (Reed-Solomon encoded digital information) recorded on the recording medium (channel 252), inversely NRZI converts (decodes) the reproduced digital information, and supplies the decoded digital information to the decoding apparatus 253.

The decoding apparatus 253 is a decoder corresponding to the encoding apparatus 251, and includes m decoding sections 261-1 to 261-m connected in series and having a configuration similar to that of the decoding apparatus 203 described hereinabove with reference to FIG. 8 for performing a decoding process similar to that of the decoding apparatus 203.

Each of the decoding sections 261-1 to 261-m includes n ABP decoding sections 231-1 to 231-n which correspond to the RS encoding sections 211-1 to 211-n of the encoding apparatus 251, respectively, and are connected in series for performing a repetitive decoding process, in which the ABP is used, for the Reed-Solomon codes relating to the dimensions similarly as in the case of the decoding apparatus 203 of FIG. 8.

In particular, in the decoding apparatus 253, the ABP decoding sections 231-1 to 231-n of the decoding section 261-1 first perform a repetitive decoding process in which the ABP is used and a selection process of a decoded word from within a resulting decoded word list for digital information supplied thereto from the recording and reproduction processing section (not shown) (digital information supplied thereto through the channel 252).

Thereupon, the decoding section 261-1 operates reversely to the operation of the encoding apparatus 251. In particular, in the decoding section 261-1, the ABP decoding section 231-n first performs a decoding process relating to the nth dimension, and then the ABP decoding sections connected in series perform a decoding process successively decreasing the dimension number to the n–1th dimension, n–2th dimension and so forth. Finally, the ABP decoding section 231-1 performs a decoding process relating to the first dimension.

After the decoding process comes to an end, the decoding section 261-1 supplies the decoded digital information to the decoding section 261-2. The decoding section 261-2 performs a repetitive decoding process, in which the ABP is used for each dimension, successively decreasing the dimension number one by one using the ABP decoding sections 231-1 to 231-n similarly as in the case of the decoding section 261-1, and supplies the decoded digital information to the next decoding section. The decoding process is successively performed in order up to the mth decoding section 261-m in this manner. When the decoding process by the decoding section 261-m is completed, the decoding apparatus 253 outputs the decoded digital information to the outside of the recording and reproduction apparatus (error correction system 250).

The decoding apparatus 253 having the configuration described above can perform a decoding process of a high performance readily, and the error correction system 250 as a recording and reproduction apparatus can record and reproduce digital information with a higher degree of accuracy. Further, since the decoding apparatus 253 performs repetitive decoding to narrow down candidates to a decoded word before the ABP decoding sections 231-1 to 231-n perform MAP decoding (selection of decoded words), the load of the decoding process can be reduced and the production cost and the operation cost of the decoding apparatus 253 can be suppressed.

It is to be noted that, while the error correction system 250 described above uses the Reed-Solomon codes, the codes to be used are not limited to them, but, for example, the BCH codes may be applied, or any other encoding method may be applied.

While the series of processes described above can be executed by hardware, it may otherwise be executed by software. In this instance, for example, the decoding apparatus and the error correction system described hereinabove may each be formed as such a personal computer as shown in FIG. 10.

Referring to FIG. 10, a central processing unit (CPU) 301 of the personal computer 300 executes various processes in accordance with a program stored in a ROM (Read Only Memory) 302 or a program loaded from a storage section 313 into a RAM (Random Access Memory) 303. Data and so forth necessary for the CPU 301 to execute the processes are also suitably stored into the RAM 303.

The CPU 301, ROM 302 and RAM 303 are connected to one another by a bus 304. Also an input/output interface 310 is connected to the bus 304.

An inputting section 311 including a keyboard, a mouse and so forth, an outputting section 312 including a display unit which may be a CRT (Cathode Ray Tube) or an LCD (Liquid Crystal Display) unit, a speaker and so forth, a storage section 313 formed from a hard disk or the like, a communication section 314 including a modem and so forth are connected to the input/output interface 310. The communication section 314 performs a communication process through a network including the Internet.

Further, as occasion demands, a drive 315 is connected to the input/output interface 305. A removable medium 321 such as a magnetic disk, an optical disk, a magneto-optical disk, a semiconductor memory or the like is suitably loaded into the drive 315, and a computer program read from the loaded removable medium 321 is installed into the storage section 313 as occasion demands.

Where the series of processes described above is executed by software, a program which constructs the software is installed from a network or a recording medium.

The recording medium is formed, for example, as shown in FIG. 10, as a removable medium 321 which is distributed to provide the program to a user separately from an apparatus body and may be a magnetic disk (including a floppy disk), an optical disk (including a CD-ROM (Compact Disk-Read Only Memory) and a DVD (Digital Versatile Disk)), or a magneto-optical disk (including an MD (Mini Disc) (registered trademark), or a semiconductor memory which has the program recorded thereon or therein. Else, the recording medium may be formed as the ROM 302, a hard disk included in the storage section 313 or the like in which the program is recorded and which is distributed to a user in a state wherein the program is incorporated in an apparatus body.

It is to be noted that, in the present specification, the steps which describe the program recorded in a recording medium may be but need not necessarily be processed in a time series in the order as described, and include processes which are executed in parallel or individually without being processed in a time series.

Further, in the present specification, the term "system" is used to represent an entire apparatus composed of a plurality of devices (apparatus). It is to be noted that any component described as an apparatus hereinabove may be divided into a plurality of apparatus. Conversely, a plurality of components described as different apparatus may be collected into a single apparatus. Further, any other device or apparatus may naturally be added to any component of the apparatus described above. Furthermore, if the configuration or operation of the entire system is substantially same, then a component of a certain apparatus may be included in another apparatus.

While a preferred embodiment of the present invention has been described using specific terms, such description is for illustrative purpose only, and it is to be understood that changes and variations may be made without departing from the spirit or scope of the following claims.

What is claimed is:

1. A decoding apparatus which performs a decoding process for a linear code on ring R, comprising:
    repetitive decoding means for performing repetitive decoding in which belief propagation is used for a codeword supplied;
    decoded word list production means for producing and retaining a list of decoded words obtained by the repetitive decoding by said repetitive decoding means; and
    decoded word selection means for selecting one of the decoded words from within the decoded word list produced by said decoded word list production means.

2. The decoding apparatus according to claim 1, wherein said repetitive decoding means includes:
    retaining means for retaining the codeword and information relating to a reliability order which is an order of reliability values of values of symbols of the codeword;
    diagonalization means for diagonalizing a parity check matrix based on the information relating to the reliability order retained in said retaining means;
    belief propagation means for performing belief propagation using the parity check matrix diagonalized by said diagonalization means to update a message;
    log likelihood ratio calculation means for calculating a log likelihood ratio of each of the symbols of the codeword using the message updated by the belief propagation performed by said belief propagation means;
    reliability order search means for searching for a reliability order of the log likelihood ratios calculated by said log likelihood ratio calculation means and updating the codeword and the information relating to the reliability order retained in said retaining means using the log likelihood ratios and the information of the reliability order of the log likelihood ratios;
    decoding means for performing decoding using the log likelihood ratios calculated by said log likelihood ratio calculation means; and
    decoding control means for controlling said diagonalization means, belief propagation means, log likelihood ratio calculation means, reliability order search means and decoding means to repeat the diagonalization of the parity check matrix, the belief propagation, the calculation of the log likelihood ratios, the search for the reliability order and the decoding by a predetermined number of times, respectively.

3. The decoding apparatus according to claim 2, wherein the predetermined number of times has a value determined in advance.

4. The decoding apparatus according to claim 2, wherein said diagonalization means performs the diagonalization preferentially in order beginning with a column of the parity check matrix which corresponds to a reception symbol which has the lowest reliability value.

5. The decoding apparatus according to claim 2, wherein said diagorialization means arranges the columns of the parity check matrix in an ascending order of the reliability of the reception symbols corresponding to the columns, re-arranges part of the order in accordance with a predetermined method, and performs the diagonalization of the columns of the parity check matrix in the re-arranged order.

6. The decoding apparatus according to claim 2, wherein said diagonalization means prepares in advance a plurality of different determination methods for initial values to priority ranks of the columns of the parity check matrix for which the diagonalization is to be performed and changes the determination method to be used every time the priority order ranks are initialized.

7. The decoding apparatus according to claim 2, wherein said decoding means uses the log likelihood ratios calculated by said log likelihood ratio calculation means to perform hard-definition decoding.

8. The decoding apparatus according to claim 2, wherein said decoding means uses finite field $F_q(q=p^m)$ algebraic-geometric codes or isomorphic codes and performs decoding receiving the reliability values obtained by a plural number of times of updating as inputs thereto, p being a prime number.

9. The decoding apparatus according to claim 8, wherein said decoding means receives the reliability values obtained by the plural number of times of updating as inputs to perform hard-decision list decoding according to the Sudan algorithm, the Grusuwami-Sudan algorithm or some other algorithm for the Reed-Solomon codes, the BCH codes or isomorphic codes of the algebraic-geometric codes.

10. The decoding apparatus according to claim 8, wherein said decoding means receives the reliability values obtained by the plural number of times of updating as inputs to perform redundancy setting and soft-decision list decoding according to the Sudan algorithm, the Koetter-Vardy algorithm or some other algorithm for the Reed-Solomon codes, the BCH codes or isomorphic codes of the algebraic-geometric codes.

11. The decoding apparatus according to claim 1, wherein said decoded word selection means performs maximum posteriori probability decoding for the decoded words registered in the decoded word list to select one of the decoded words.

12. A decoding method for a decoding apparatus which performs a decoding process for a linear code on ring R, comprising the steps of:

performing repetitive decoding in which belief propagation is used for a codeword supplied;

producing a list of decoded words obtained by the process at the repetitive decoding step and placing the produced decoded word list into a retaining section; and selecting one of the decoded words from within the decoded word list produced by the process at the decoded word list production step.

13. A decoding apparatus which performs a decoding process for a linear code on ring R, comprising:

a repetitive decoding section for performing repetitive decoding in which belief propagation is used for a codeword supplied;

a decoded word list production section for producing and retaining a list of decoded words obtained by the repetitive decoding by said repetitive decoding section; and a decoded word selection section for selecting one of the decoded words from within the decoded word list produced by said decoded word list production section.

* * * * *